(12) United States Patent
Guedon

(10) Patent No.: US 11,368,052 B2
(45) Date of Patent: Jun. 21, 2022

(54) LDO FREE WIRELESS POWER RECEIVER HAVING REGTIFIER

(71) Applicant: STMicroelectronics Asia Pacific Pte Ltd, Singapore (SG)

(72) Inventor: Yannick Guedon, Singapore (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 16 days.

(21) Appl. No.: 16/930,651

(22) Filed: Jul. 16, 2020

(65) Prior Publication Data
US 2022/0021241 A1 Jan. 20, 2022

(51) Int. Cl.
| H02M 1/08 | (2006.01) |
| H02J 50/12 | (2016.01) |
| H02J 50/10 | (2016.01) |
| H02M 1/00 | (2006.01) |
| H02M 7/219 | (2006.01) |

(52) U.S. Cl.
CPC .............. *H02J 50/12* (2016.02); *H02J 50/10* (2016.02); *H02M 1/0003* (2021.05); *H02M 1/08* (2013.01); *H02M 7/219* (2013.01); *H02M 7/2195* (2021.05)

(58) Field of Classification Search
CPC ........ H02J 50/12; H02J 50/10; H02M 1/0003; H02M 1/08; H02M 7/219; H02M 7/2195
See application file for complete search history.

(56) References Cited

U.S. PATENT DOCUMENTS

| 6,657,875 | B1 | 12/2003 | Zeng et al. |
| 2016/0126844 | A1* | 5/2016 | Tschirhart ......... H02M 3/33592 363/17 |
| 2017/0149353 | A1* | 5/2017 | Hung ...................... H02M 1/08 |
| 2020/0166960 | A1* | 5/2020 | Poletto .................... H03F 3/505 |

FOREIGN PATENT DOCUMENTS

| CN | 111030314 A | 4/2020 |
| GB | 2187312 A | 9/1987 |

OTHER PUBLICATIONS

Cheng, Lin, et al: "A 6.78-MHz Single-Stage Wireless Charger With Constant-Current Constant-Voltage Charging Technique," IEEE Journal of Solid-State Circuits, vol. 55, No. 4, Apr. 2020, pp. 999-1010.
EPO Search Report for family-related EP Appl. No. 21184168.9, report dated Nov. 18, 2021, 9 pages.

* cited by examiner

*Primary Examiner* — Kyle J Moody
*Assistant Examiner* — Jye-June Lee
(74) *Attorney, Agent, or Firm* — Crowe & Dunlevy

(57) ABSTRACT

Disclosed herein is a bridge rectifier and associated control circuitry collectively forming a "regtifier", capable of both rectifying an input time varying voltage as well as regulating the rectified output voltage produced. To accomplish this, the gate voltages of transistors of the bridge rectifier that are on during a given phase may be modulated via analog control (to increase the on-resistance of those transistors) or via pulse width modulation (to turn off those transistors prior to the end of the phase). Alternatively or additionally, the transistors of the bridge rectifier that would otherwise be off during a given phase may be turned on to help dissipate excess power and thereby regulate the output voltage. A traditional voltage regulator, such as a low-dropout amplifier, is not used in this design.

47 Claims, 28 Drawing Sheets

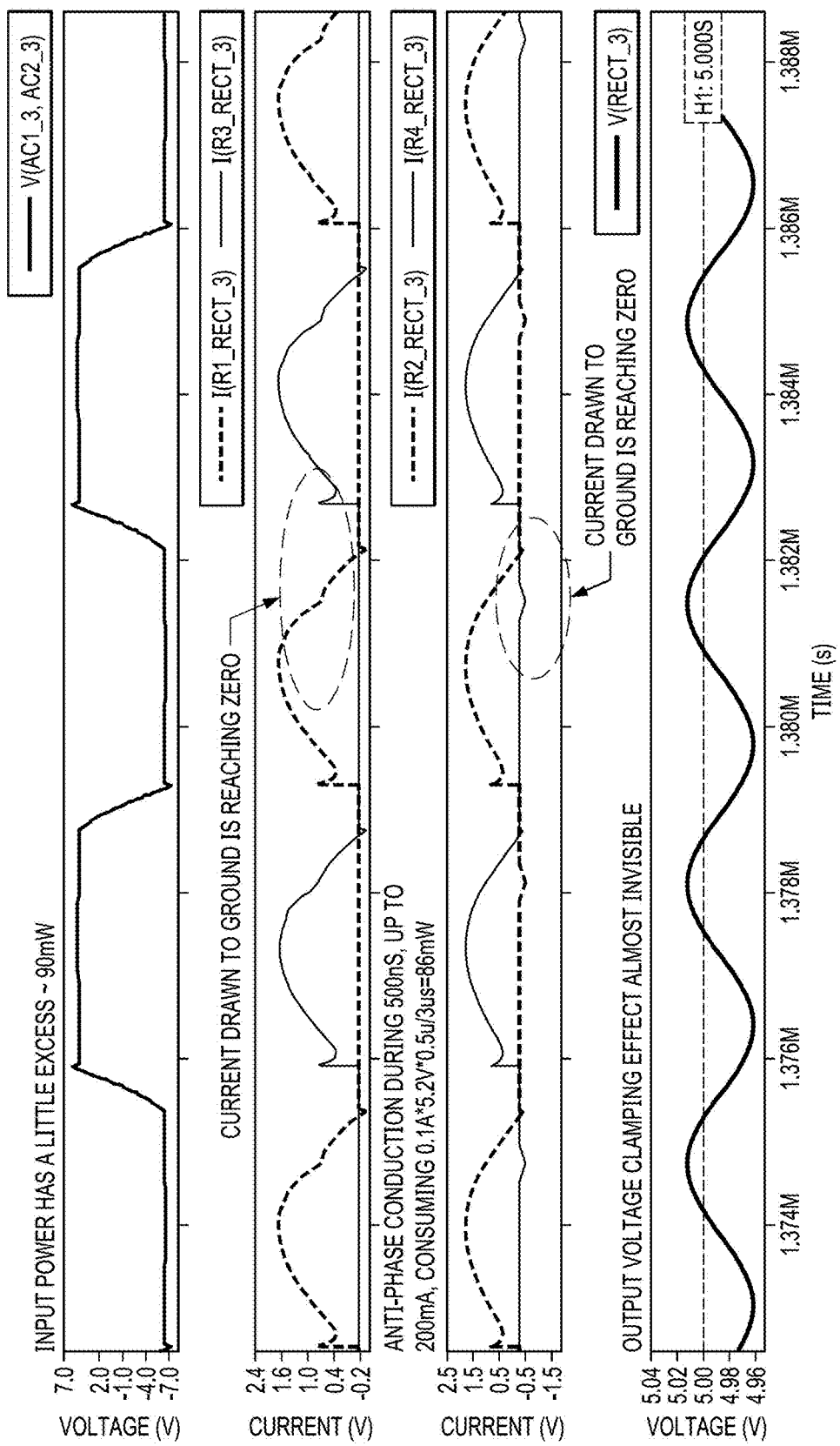

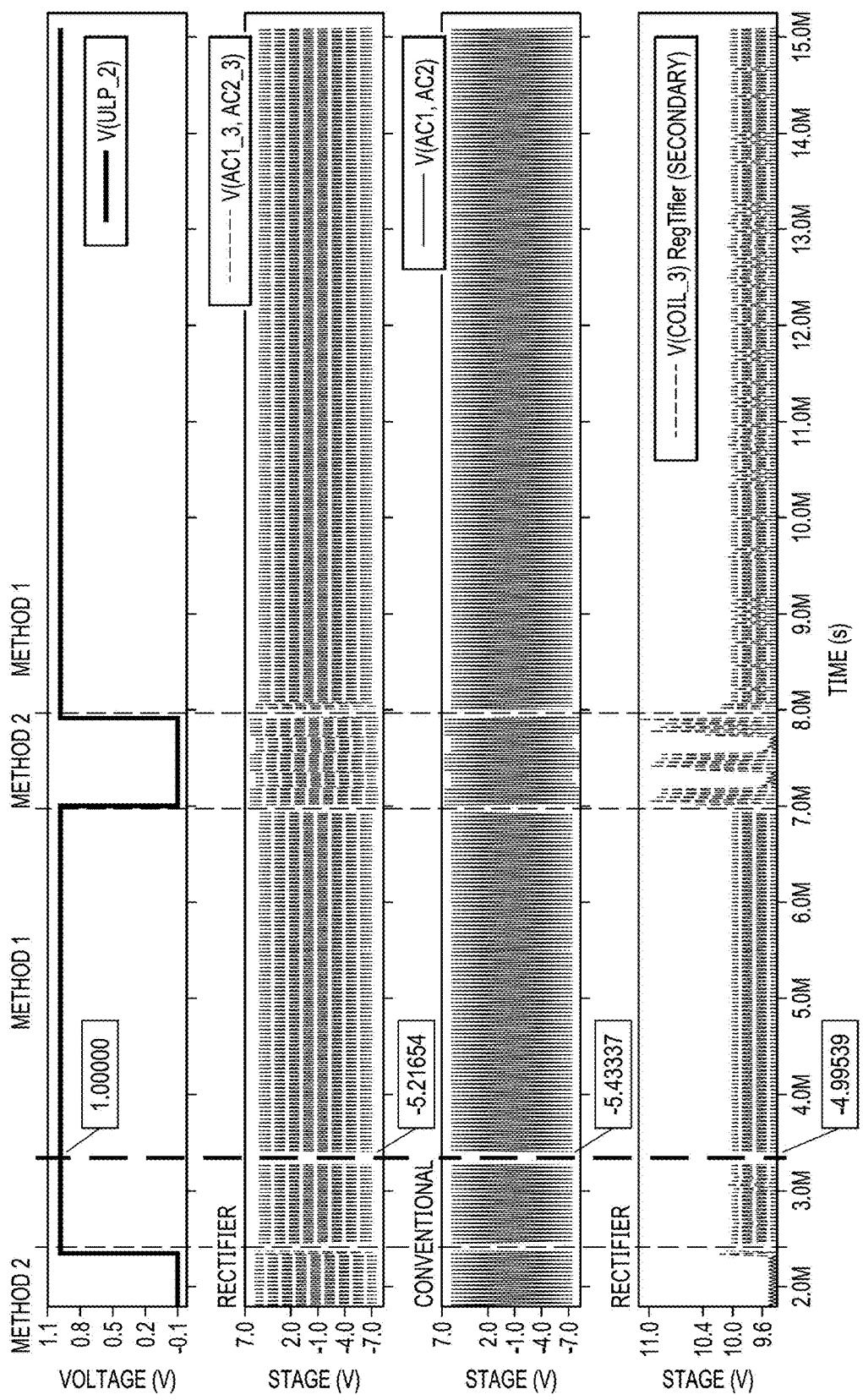

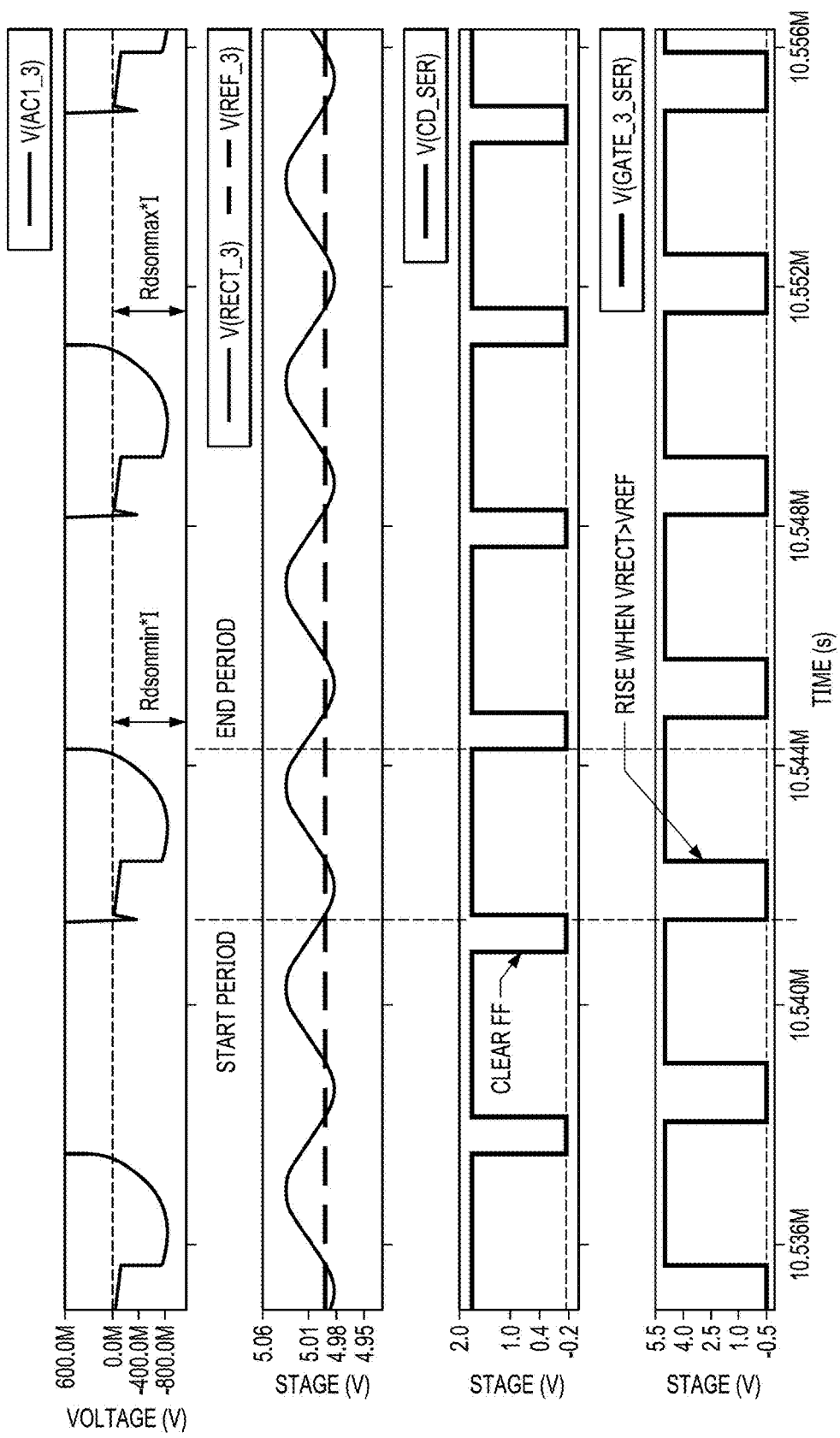

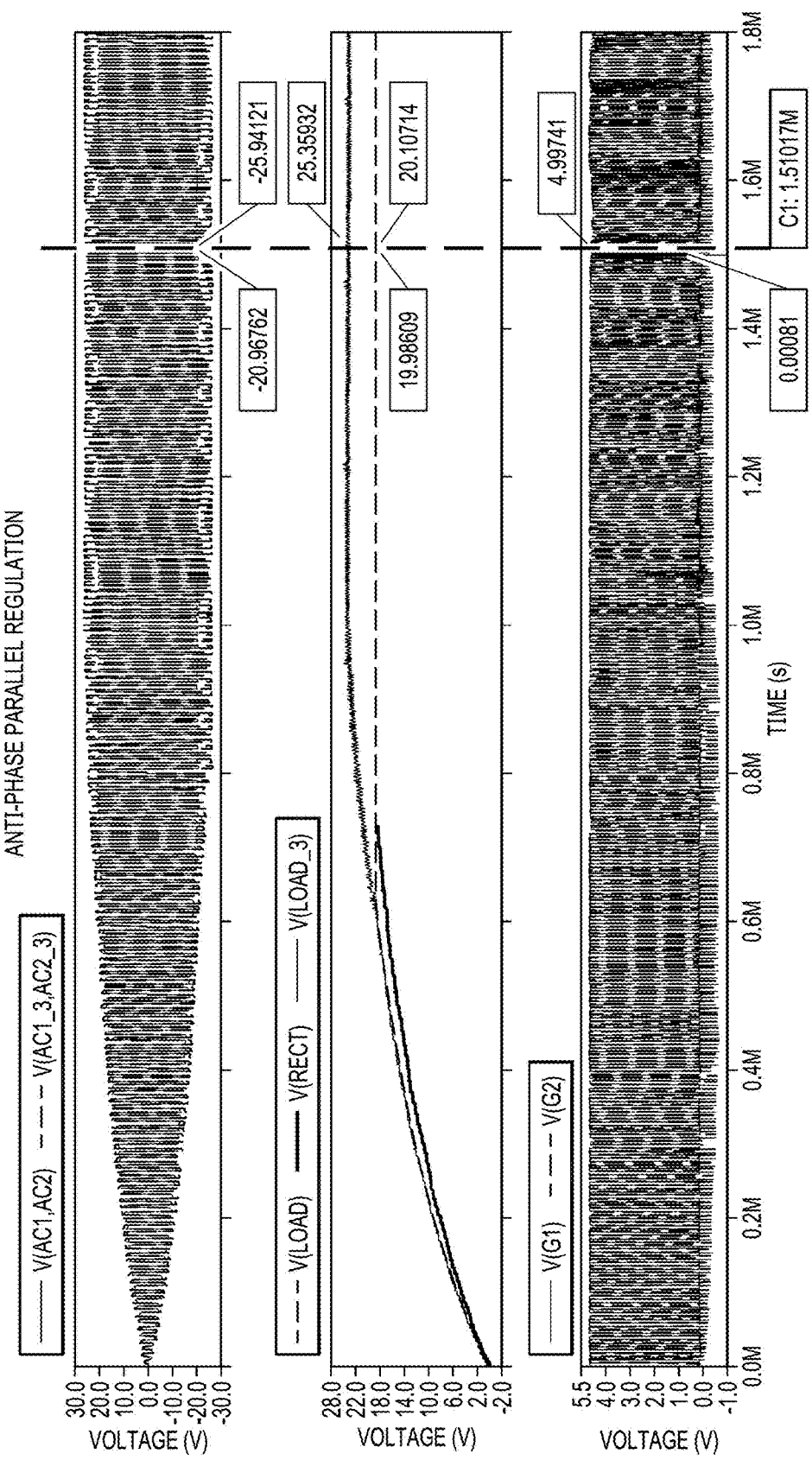

US 11,368,052 B2

LDO FREE WIRELESS POWER RECEIVER HAVING REGTIFIER

TECHNICAL FIELD

This disclosure is directed to the field of wireless power transmission and, in particular, to hardware, operating techniques for the hardware, and methods for causing a bridge rectifier to perform both rectification and regulation functions.

BACKGROUND

Portable electronic devices, such as smartphones, smartwatches, audio output devices (earbuds, headphones), and wearables operate on battery power, and not from wired power transmitted thereto over wired transmission lines and distribution systems. The batteries used for such devices are typically rechargeable and, therefore, a way to recharge the power of such batteries is necessary.

Most portable electronic devices include a charging port, typically conforming to the Micro USB or USB-C standards, into which a power cord connected to a power source can be inserted to provide for recharging of their batteries. However, such charging ports may make it difficult to enhance the water resistance of the electronic device, and are subject to damage from repeated use. In addition, some smaller portable electronic devices (for example, earbuds and smartwatches) may lack the available space to provide for a charging port. Still further, some users may find it cumbersome to plug a power cord into the charging port of an electronic device to charge the battery of that device.

Therefore, to address these issues, wireless power transmission has been developed. As shown in FIG. 1, a typical prior art wireless power transmission system 10 utilizes a transmitter 11 including a transmission coil Lp and a serial capacitance Cp forming a serial resonant L,C network, driven by electric power from a power source 12 (typically a wired connection, but in some cases a battery), that generates a time-varying electric field, and a receiver 15 including a receiver coil Ls and a serial capacitance Cs forming a similar serial resonant L,C network in which the time-varying electric field induces an AC current. Other possible configurations exist where L,C are in parallel on the primary side and/or the secondary side, offering four possible schemes—serial-serial, serial-parallel, parallel-serial, and parallel-parallel. Each scheme may present some advantages and/or disadvantages depending on the application, and the serial-serial configuration is the most widely used in recent developments for the mobile device market. The receiver 15 includes a bridge rectifier 16 (comprised of the illustrated diodes D1-D4) that rectifies the AC current to produce a DC current that charges a tank capacitor Ctank connected to an input node Nin of a regulator 17 to a regulator input voltage. The regulator 17, typically a low dropout amplifier, produces a regulated output voltage at its output node Nout, which is provided to a load (represented by the load resistance R1 and the load capacitance C1).

While such prior art wireless power transmission systems 10 are functional and in wide use, the usage of the regulator 17 consumes a substantial amount of integrated circuit area due to its use of a large power MOS device. Since such wireless power transmission systems 10 are primarily utilized in portable electronic devices, this area consumption is undesirable. Therefore, further development into wireless power transmission systems is needed.

SUMMARY

Disclosed herein is a bridge rectifier and associated control circuitry collectively forming a "regtifier", capable of both rectifying an input time varying voltage as well as regulating the rectified output voltage produced. To accomplish this, the gate voltages of transistors of the bridge rectifier that are on during a given phase may be modulated via analog control (to increase the on-resistance of those transistors) or via pulse width modulation (to turn off those transistors prior to the end of the phase). Alternatively or additionally, the transistors of the bridge rectifier that would otherwise be off during a given phase may be turned on to help dissipate excess power and thereby regulate the output voltage. A traditional voltage regulator, such as a low-dropout amplifier, is not used in this design.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein. Note that when transistors are described below as being "on", this means that those transistors are operating in the linear region or saturation region, and are not operating in the cut-off region.

A. Hardware Description

Figure 1:
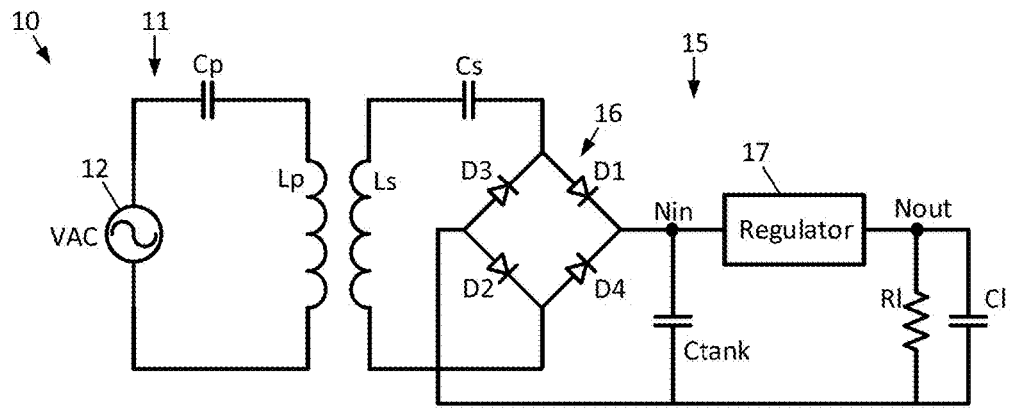
FIG. 1 is a schematic block diagram of a prior art wireless power transmission system.
Figure 2:
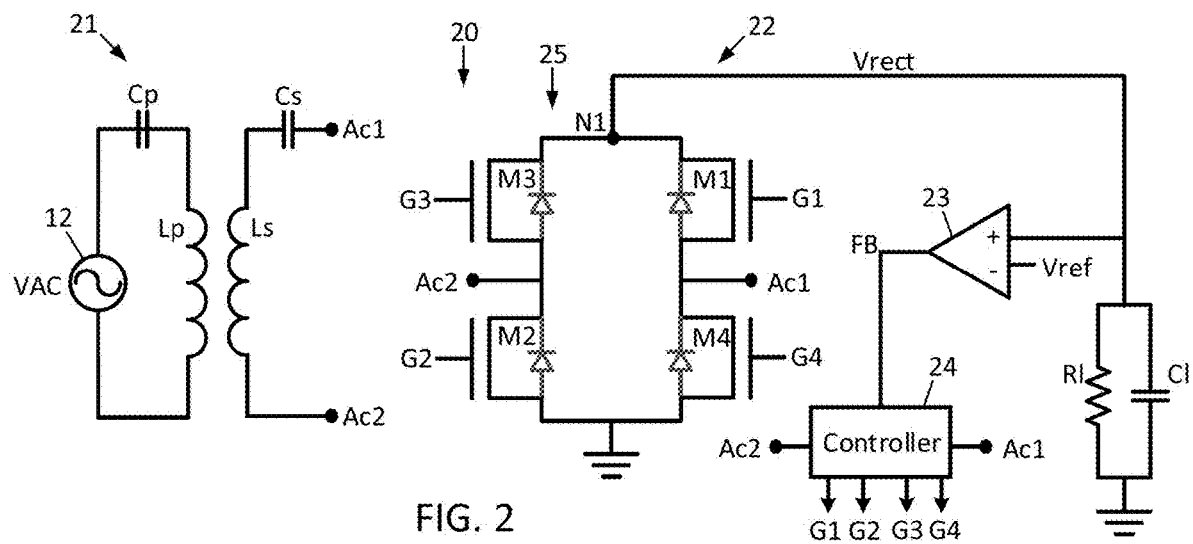
FIG. 2 is a schematic block diagram of a wireless power transmission system disclosed herein in which the bridge rectifier also performs a regulation function, enabling the lack of an additional voltage regulation circuit.

Now described with reference to FIG. 2 is a wireless power transmission system 20 including a transmitter 21 and a receiver 22. The transmitter 21 is comprised of an AC voltage source 12 coupled to a serial resonant transmitter coil Lp and capacitance Cp. The receiver 22 includes a serial resonant receiver coil Ls and capacitance Cs coupled between nodes Ac1 and Ac2, and a "regtifier" 25 (a bridge rectifier also capable of voltage regulation when controlled using techniques described below) formed by transistors M1-M4 coupled between node N1 and ground.

The regtifier is formed by: an n-channel transistor M1 having a drain connected to node N1, a source connected to node Ac1, and a gate coupled to receive a control signal G1; an n-channel transistor M4 having a drain connected to node Ac1, a source connected to ground, and a gate coupled to receive a control signal G4; an n-channel transistor M3 having a drain connected to node N1, a source connected to node Ac2, and a gate coupled to receive a control signal G3; and a an n-channel transistor M2 having a drain connected to node Ac2, a source connected to ground, and a gate coupled to receive a control signal G2.

An amplifier 23 has an inverting input terminal coupled to receive a reference voltage Vref (which is set to be equal to a desired output voltage Vrect at node N1), a non-inverting input terminal coupled to node N1, and an output coupled to control circuitry 24 and generating a feedback signal FB. A load is connected between node N1 and ground, and is represented by resistor R1 and capacitor C1. The control circuitry 24 itself receives input from the feedback signal FB, and based thereupon, generates the control signals G1-G4 for the transistors M1-M4.

As will be explained in detail below, the control circuitry 24 generates the control signals G1-G4 so as to cause the regtifier 25 to both rectify the AC current induced in the receiver coil Ls to produce a rectified output voltage Vrect, while at the same time suitable modulating one or more of the control signals G1-G4 so as to dissipate excess power to thereby regulate the output voltage Vrect. By dissipating excess power, the power delivered to the load by the regtifier 25 can be controlled and kept within a desired level, without the use of a separate discrete voltage regulation circuit.

Therefore, the amplifier 23 and the control circuitry 24 form a feedback loop.

B. Operation Using In-Phase Serial Voltage Regulation

Operation of the wireless power transmission system 20 under an in-phase serial voltage regulation scheme controlled by the control circuitry 24 is now described.

Figure 3:
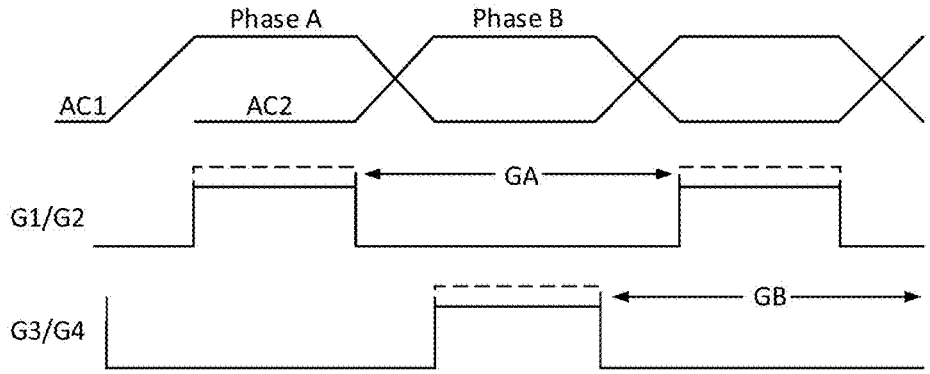
FIG. 3 is a timing diagram showing voltages of the wireless power transmission system of FIG. 2 in operation, when the feedback loop is controlling the bridge rectifier to perform in-phase serial voltage regulation.

Shown in the graph of FIG. 3 are waveform traces of the signals at the nodes Ac1 and Ac2. Notice that when the signal at Act is positive, it is labeled as Phase A, that when the signal at Ac2 is positive, it is labeled as Phase B, and that the signals at Ac1 and Ac2 are 180° out of phase with one another.

During Phase A, corresponding to the positive phase of Ac1 and the negative phase of Ac2, the control signal GA is generated and driven to a high voltage (a level sufficient to fully turn on the transistors M1-M2) by the controller 24, and the control signal GB is generated and pulled to a low voltage (a level to fully turn off the transistors M3-M4) by the controller 24. Conversely, during Phase B, the control signal GB is driven to a high voltage by the controller 24 and the control signal GA is pulled to a low voltage by the controller 24. The controller 24 generates the gate voltages G1-G4 for the transistors M1-M4, and the values of G1-G4 depend upon the voltage values of the control signals GA and GB, the voltage of the feedback signal FB, and the current phase.

When the incoming power delivered by the regtifier 25 to the load is greater than the amount of power consumed by the load, the voltage Vrect at node N1 rises to be greater than the reference voltage Vref, causing the feedback signal FB to rise. When the feedback signal FB rises, the control circuitry 24 modulates the appropriate gate voltages from among G1-G4 so as to place the associated transistors M1-M4 into the linear region (ohmic region) of operation and increase the drain to source resistance of those transistors, resulting in the excess incoming power being dissipated within the activated transistors M1-M4 of the regtifier 25. This modulation continues throughout operation, with the result being that the voltage Vrect remains close to the reference voltage Vref.

When modulation of the gate voltages G1-G4 does not occur, the gate voltages G1-G2 are equal to the voltage of control signal GA.

1. Analog Control of Transistor Gates

In greater detail, as shown in FIG. 3, the gate voltages G1 and G2 are modulated during Phase A so that the transistors M1 and M2 are not fully on, increasing the drain to source resistance of transistors M1 and M2, resulting in additional power dissipation in transistors M1 and M2 over conventional operation; the gate voltages G3 and G4 remain pulled low such that the transistors M3 and M4 remain off. This configuration of the transistors M1-M4 can be seen in FIG. 4.

During Phase B, as shown in FIG. 3, the gate voltages G3 and G4 are modulated so that the transistors M3 and M4 are not fully on, increasing the drain to source resistance of transistors M3 and M4, resulting in additional power dissipation in transistors M3 and M4 over conventional operation; the gate voltages G1 and G2 remain pulled low such that the transistors M1 and M2 remain off. This configuration of the transistors M1-M4 can be seen in FIG. 5.

Figure 4:
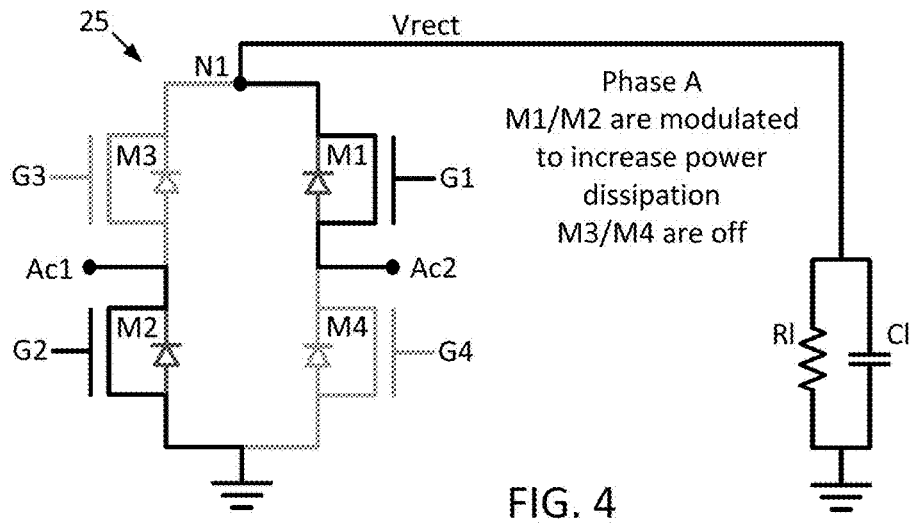
FIG. 4 is a schematic block diagram of the wireless power transmission system of FIG. 2 showing its operation during phase A of the in-phase serial voltage regulation of FIG. 3.
Figure 5:
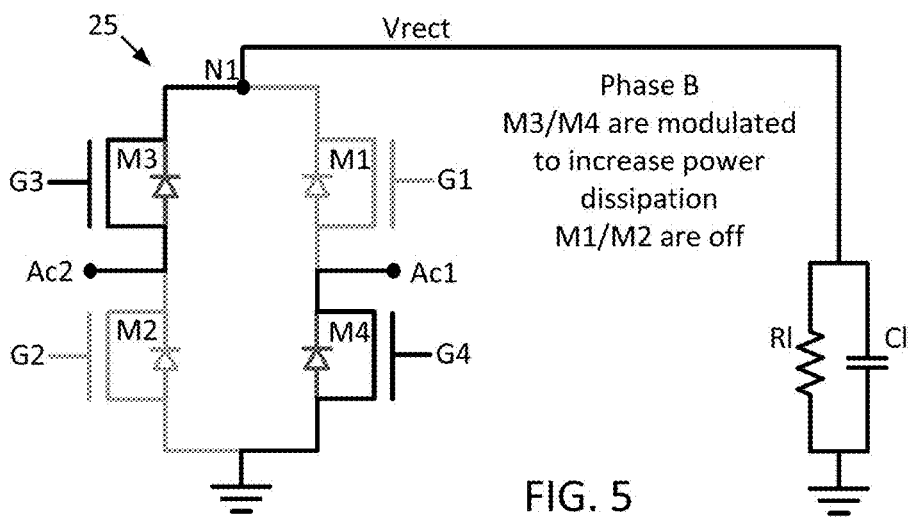
FIG. 5 is a schematic block diagram of the wireless power transmission system of FIG. 2 showing its operation during phase B of the in-phase serial voltage regulation of FIG. 3.

This operating scheme is referred to as in-phase serial regulation because the transistors M1-M4 that are conventionally fully on during a given phase are instead conductivity modulated, and as a result and as shown in FIGS. 4-5, the power dissipation is achieved by increasing the conductivity and voltage drop within elements which are in serial in the main current path to the load during the method.

Note that during Phase A, the voltage level of the gate voltages G1 and G2 need not both be modulated to increase the drain to source resistance of their respective transistors M1 and M2, and instead only one of the gate voltages G1 or G2 can be modulated to increase the drain to source resistance of its respective transistor M1 or M2 while the other control signal can remain high to keep its respective transistor M1 or M2 fully on.

Similarly, during Phase B, the voltage level of the gate voltages G3 and G4 need not both be modulated to increase the drain to source resistance of their respective transistors M3 and M4, and instead only one of the gate voltages G3 or G4 can be modulated to increase the drain to source resistance of its respective transistor M3 or M4 while the other control signal can remain high to keep its respective transistor M3 or M4 fully on.

The choice of applying the technique to one or more elements is to be appreciated/considered versus the maximum amount of excess power to be dissipated by the system.

Figures 9, 9A, 9B:
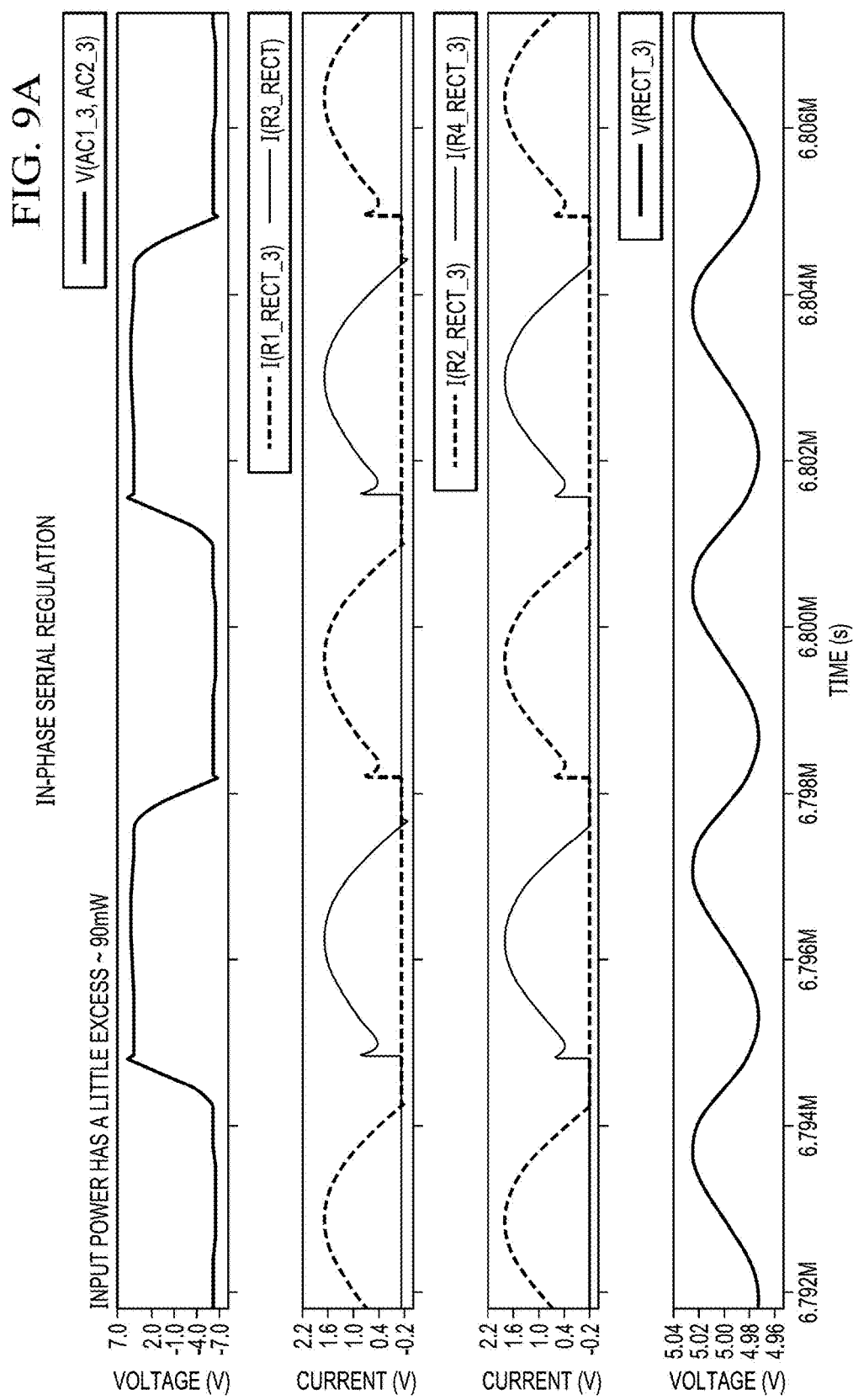
FIG. 9 is a timing diagram showing voltages of the wireless power transmission system of FIG. 2 in operation, when the feedback loop is controlling the bridge rectifier to perform low-side in-phase serial voltage regulation. The regulation is applied on the low-side only in this example for allowing a better appreciation of the substantial difference between the drive signal applied to the low-side as per the wireless power transmission system disclosed herein and the conventional drive signal applied to the high-side as per the prior art.
Figure 9B:
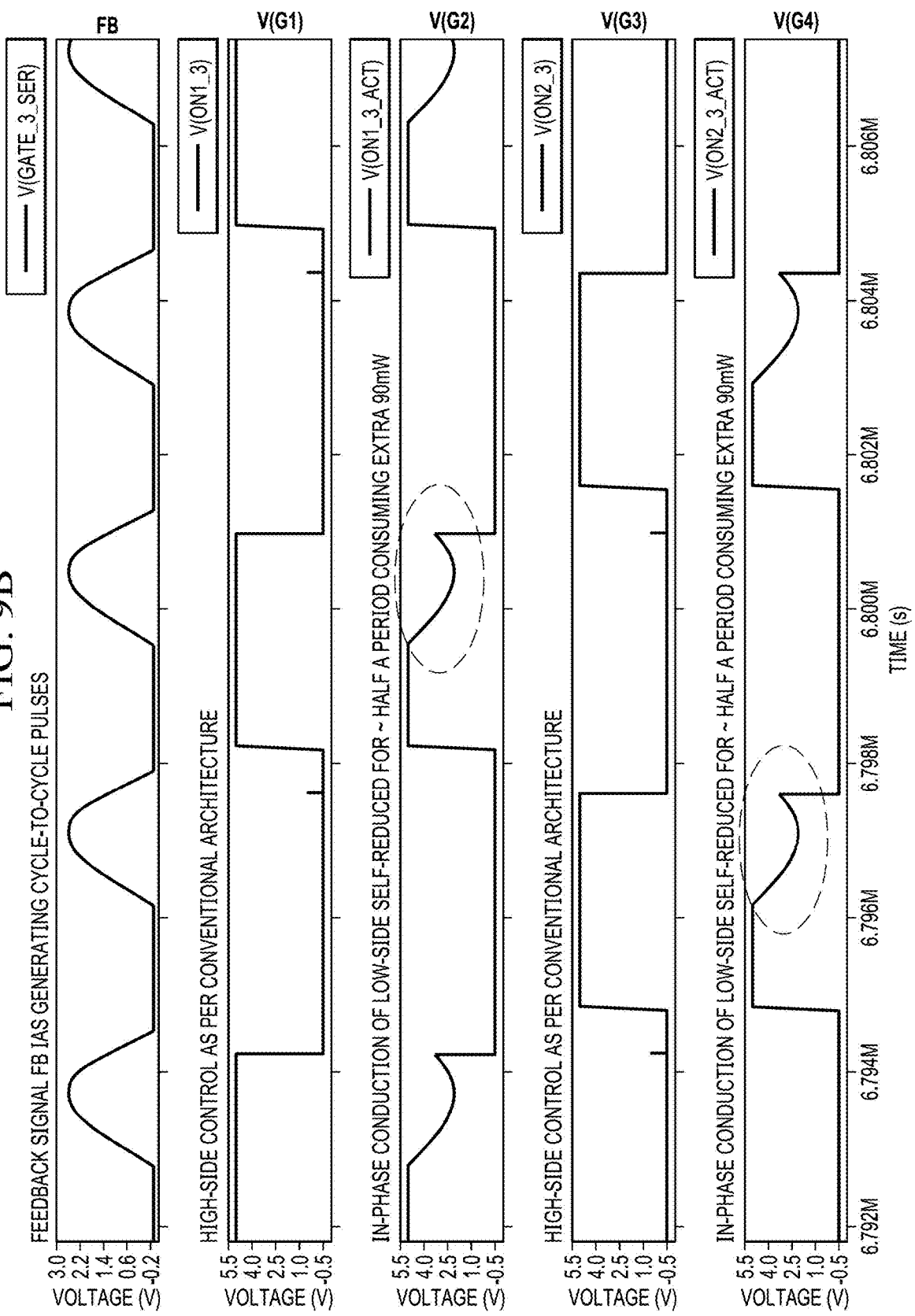

As an example of this form of operation where one transistor M1-M4 at a time is modulated, and the modulation is not flat across each pulse of the gate voltages, FIG. 9 shows additional waveforms of the wireless power transmission system 20 operating using in-phase serial regulation. Here, it can be seen that during phase A, the gate voltage G2 of the transistor M2 (which turns on the transistor M2) is pulled from a steady high voltage of 5.0V to less than 4V while the gate voltage G1 of the transistor M1 (which turns on the transistor M1) remains high and the gate voltages G3 and G4 of the transistors M3 and M4 remain low. Here, it can also be seen that during phase B, the gate voltage G4 of the transistor M4 (which turns on the transistor M4) is pulled from a steady high voltage of 5.0V to less than 4V while the gate voltages G3 of the transistor M3 (which turns on the transistor G3) remains high and the gate voltages G1 and G2 of the transistors M1 and M2 remain low.

Notice that when the gate voltages G2 and G4 are pulled downward from being fully high so as to modulate the on-resistance of transistors M2 and M4, this is performed for approximately half the pulse of those gate voltages. However, if there is the need to consume additional power over this arrangement, the gate voltages G2 and G4 can be pulled downward from being fully high for greater than half the pulse of those gate voltages so as to modulate the on-resistance of transistors M2 and M4 for a longer period of time. These techniques are clearly applicable to the case where two transistors are once are modulated.

The in-phase serial voltage regulation scheme described above is particularly suited to use where the voltage output Vrect by the regtifier 25 is relatively low and where the expected excess power to be dissipated is relatively low.

Note that the feedback loop formed by the amplifier 23 and the control circuitry 24 may be operated at a sufficient speed so that it reacts on a cycle-to-cycle basis, enabling the control circuitry 24 to alter the generation of the gate voltages G1-G4 on a cycle-to-cycle basis when performing in-phase serial voltage regulation (meaning the gate voltages G1-G4 can be adjusted to have a different flat magnitude during each cycle, or that the gate voltages G1-G4 can be modified on the fly during each cycle such that the gate voltages G1-G4 may begin a cycle having one magnitude but that magnitude may be changed during a portion of the cycle). This feedback technique can be observed in the graph of FIG. 9, where the feedback signal FB is generated during each phase, enabling the control signals G1-G4 to be altered on a cycle-to-cycle basis.

Figure 22B:
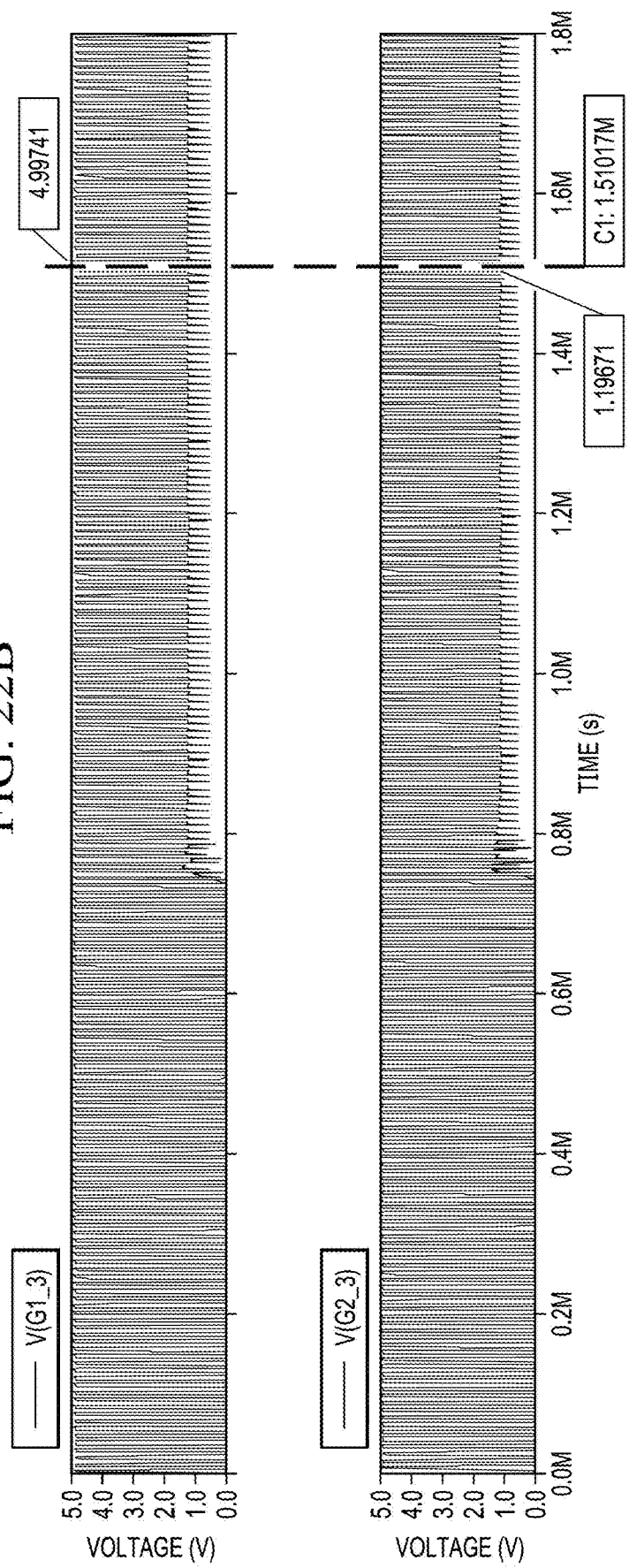
FIG. 22 is a timing diagram showing voltages of the wireless power transmission system of FIG. 2 in operation, when the feedback loop is controlling the bridge rectifier to perform low-side anti-phase parallel voltage regulation. Note that here, the feedback generation of the feedback signal is filtered, so the gates of the transistors of the bridge rectifier are driven pseudo-statically.
Figure 23:
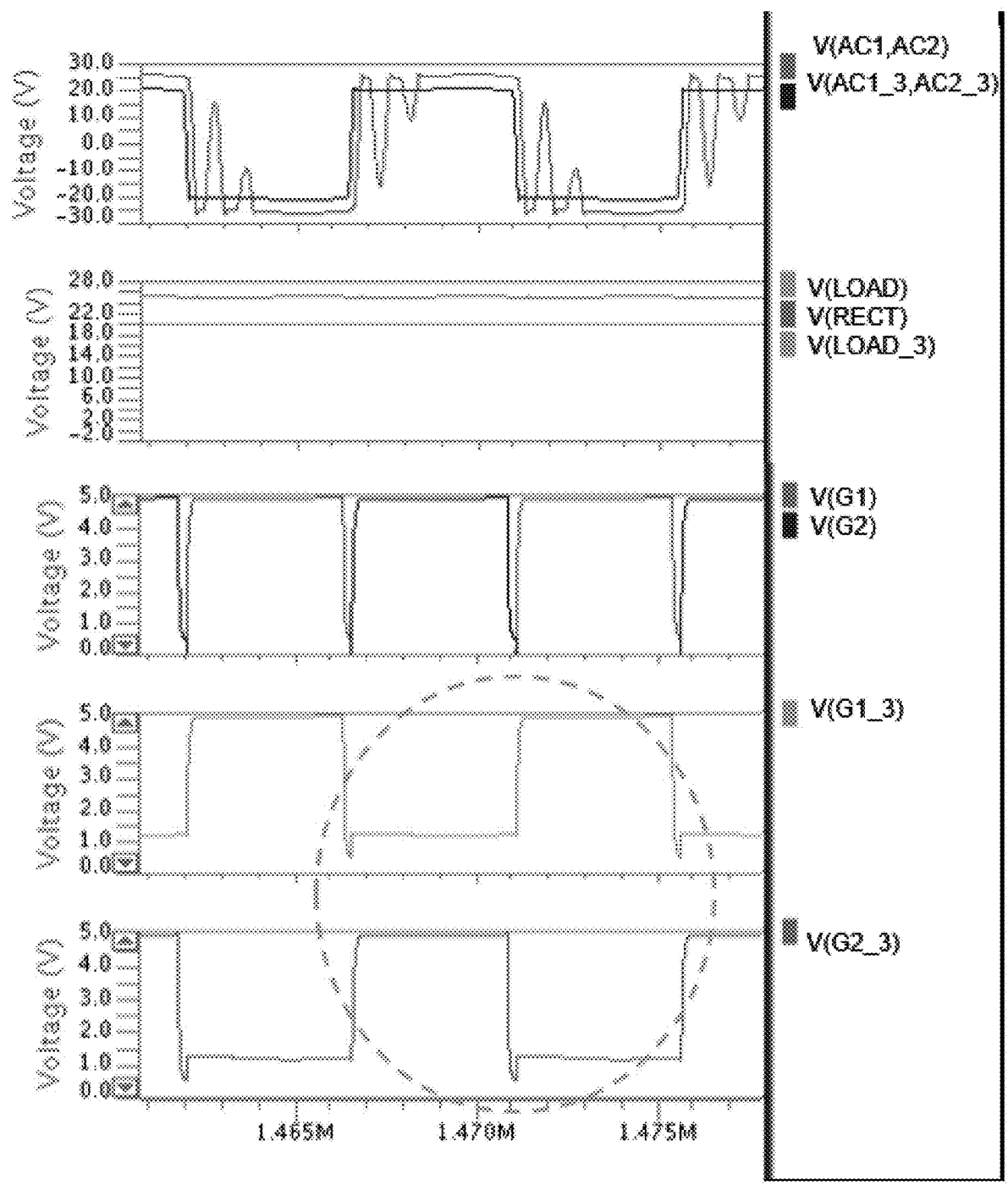
FIG. 23 is a timing diagram showing voltages of the wireless power transmission system of FIG. 2 in operation, when the feedback loop is controlling the bridge rectifier to perform low-side anti-phase parallel voltage regulation. Note that here, the feedback generation of the feedback signal is filtered, so the gates of the transistors of the bridge rectifier are driven pseudo-statically.
Figure 24A:
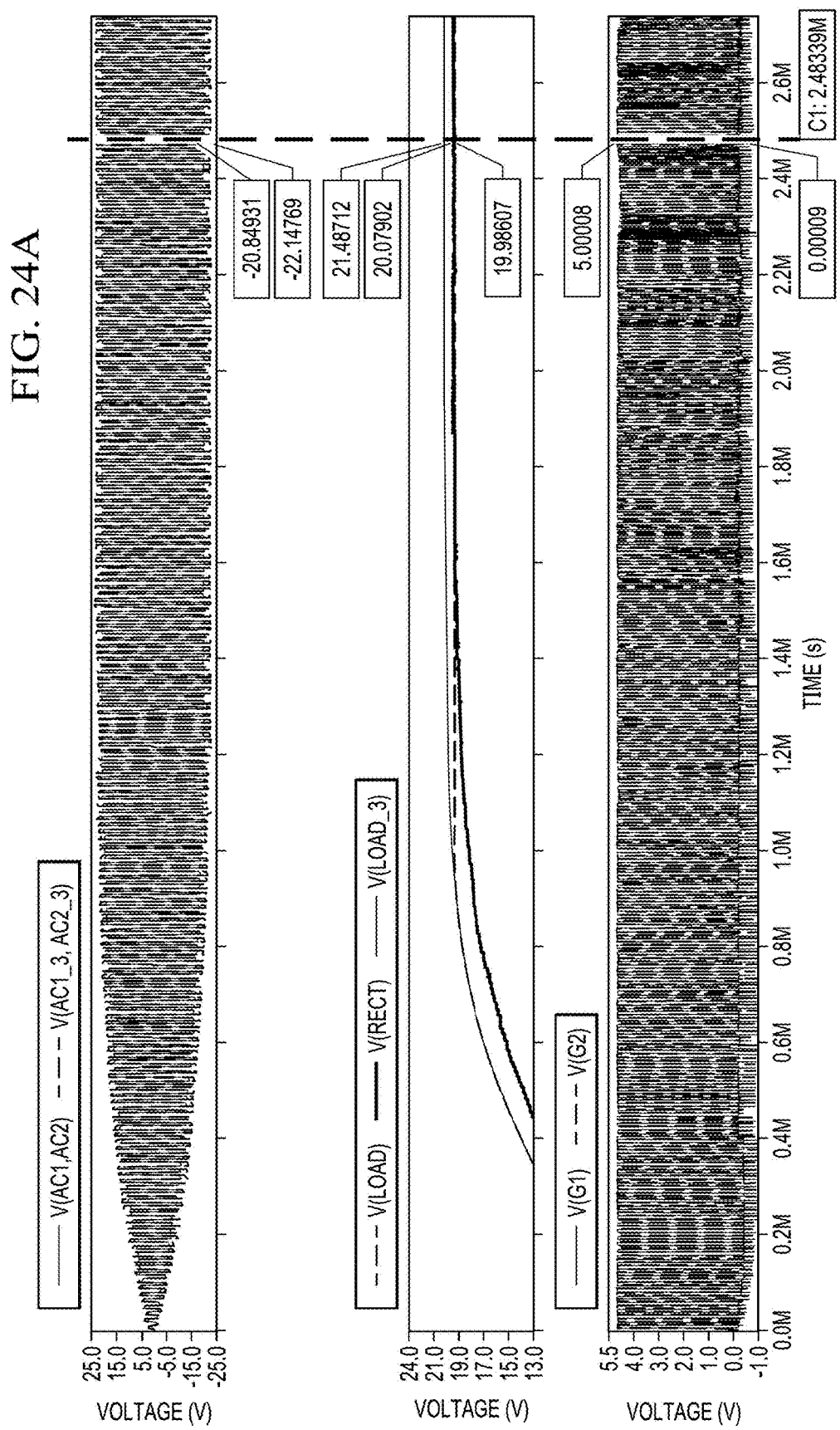
FIG. 24 is a timing diagram showing voltages of the wireless power transmission system of FIG. 2 in operation, when the feedback loop is controlling the bridge rectifier to perform low-side in-phase serial voltage regulation. Note that here, the feedback generation of the feedback signal is filtered, so the gates of the transistors of the bridge rectifier are driven pseudo-statically.
Figure 24B:
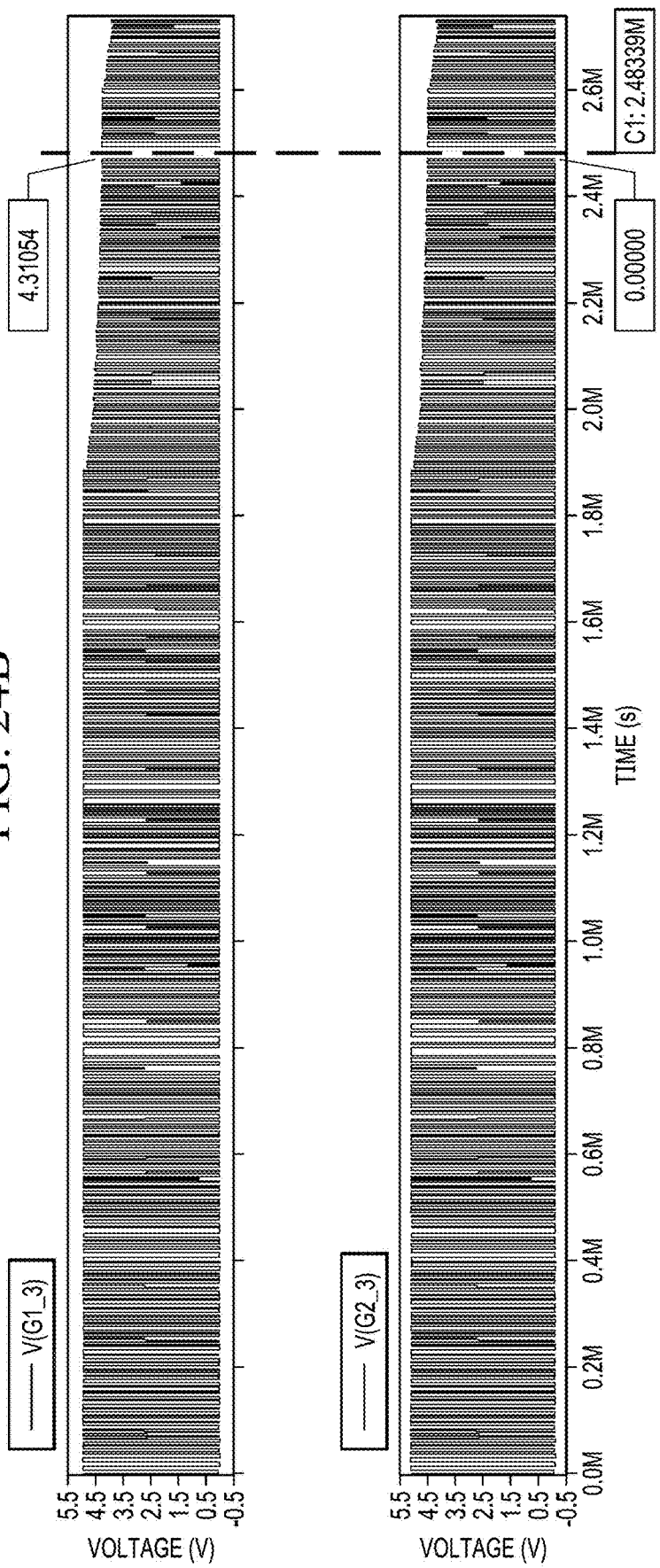
Figure 25:
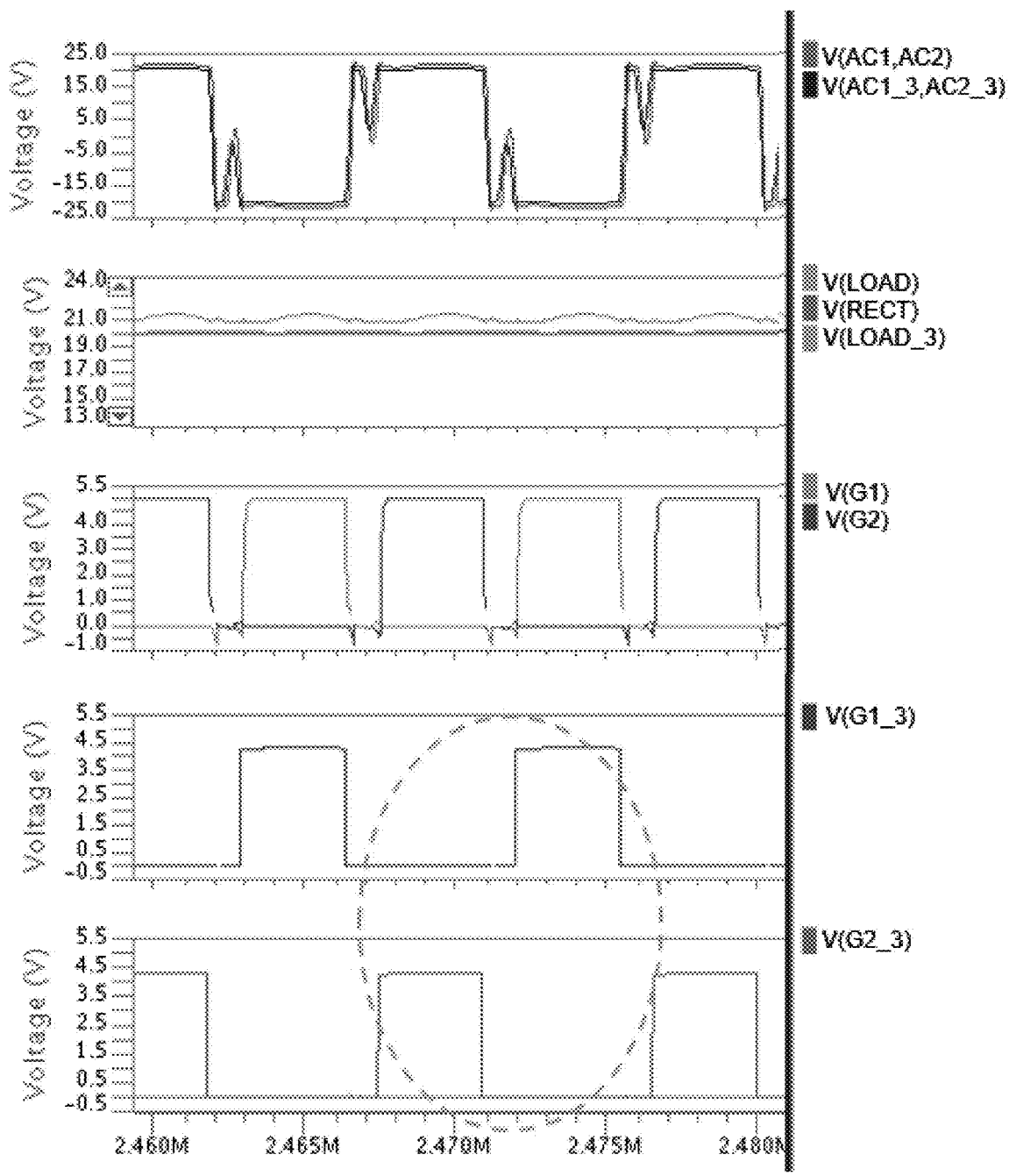
FIG. 25 is a timing diagram showing voltages of the wireless power transmission system of FIG. 2 in operation, when the feedback loop is controlling the bridge rectifier to perform low-side in-phase serial voltage regulation. Note that here, the feedback generation of the feedback signal is filtered, so the gates of the transistors of the bridge rectifier are driven pseudo-statically.

In some instances, however, the feedback loop formed by the amplifier 23 and the control circuitry 24 may be operated slowly as compared to the frequency of the signal being transmitted by the transmitter 21. This way, the generation of the feedback signal FB is not on a cycle-to-cycle basis, and instead the generation of the feedback signal FB is filtered, allowing the gates of the transistors M1-M4 to be driven pseudo-statically. Waveforms showing this mode of operation, when operating using anti-phase parallel regulation can be seen in FIGS. 22-23, and when operating using in-phase serial regulation can be seen in FIGS. 24-25.

2. PWM Control of Transistor Gates

In the description given above, the gate voltages G1-G4 of the transistors M1-M4 are modulated in an analog fashion by the control circuitry 24 to perform in-phase serial voltage regulation. Now, techniques for modulating the gate voltages G1-G4 of the transistors M1-M4 using pulse width modulation (PWM) to perform in-phase serial voltage regulation are described.

A first way in which to operate the gates of the transistors from among M1-M4 to be regulated involves simple on-off PWM. Here the amplifier 23 is configured as a comparator to provide the feedback signal FB as a digital output, resulting in a pulse FB during which the output voltage Vrect exceeds the reference voltage Vref. During this pulse, the transistors from among M1-M4 that are fully on during the current phase are turned fully off in response to the rising of FB by their respective gate voltages being pulled to ground, in turn increasing power dissipation. Thus, through feedback, the duration of the gate voltages G1-G4 driving the transistors M1-M4 are adjusted so that the output pulse duration of the regtifier 25 is just long enough to provide the requisite power but just short enough to dissipate excess power.

Figure 12:
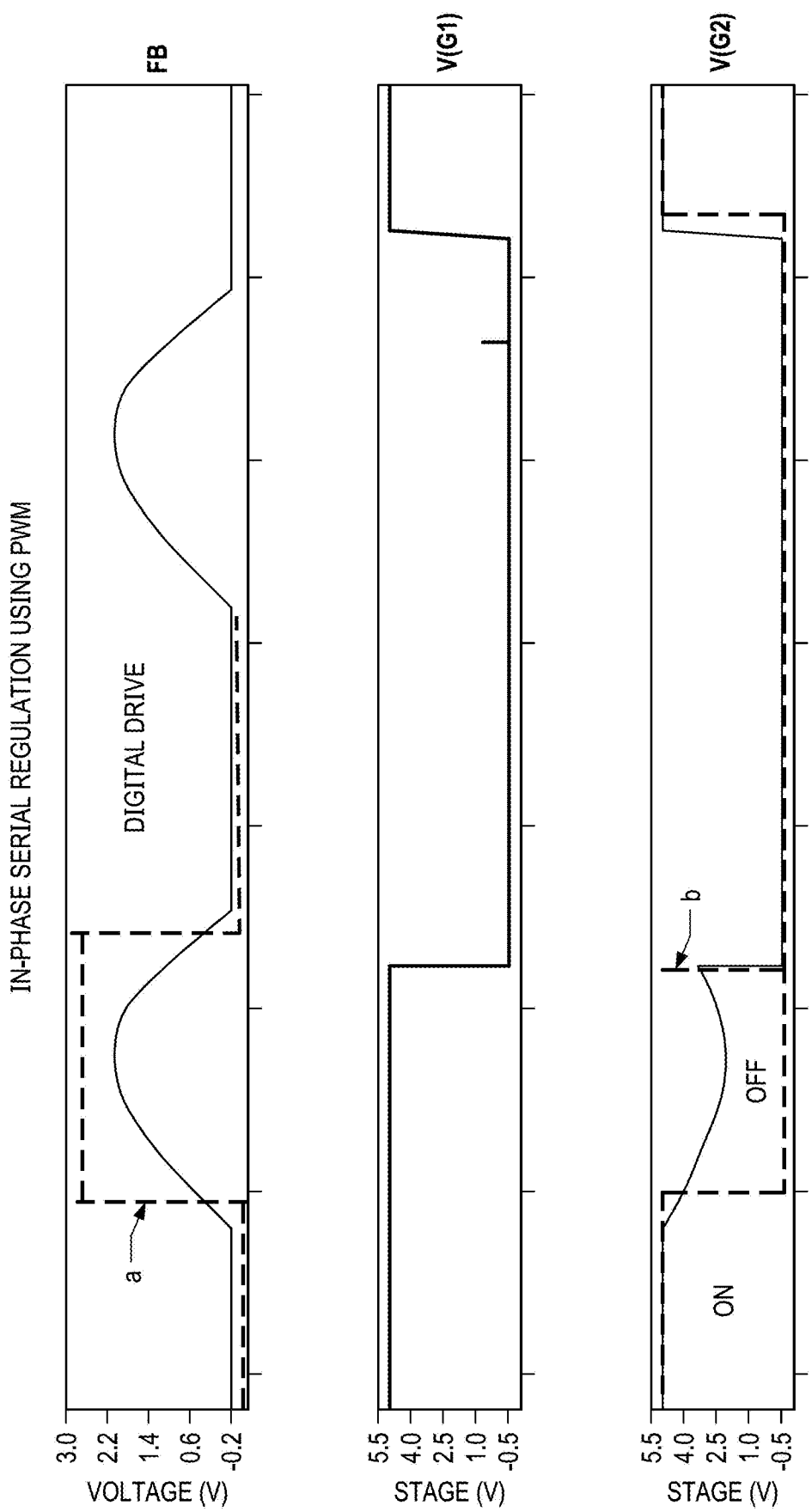
FIG. 12 is a timing diagram showing the digitization of the feedback signal FB and the PWM control of the modulated transistors, when operating using PWM based in-phase serial voltage regulation.
Figure 13A:
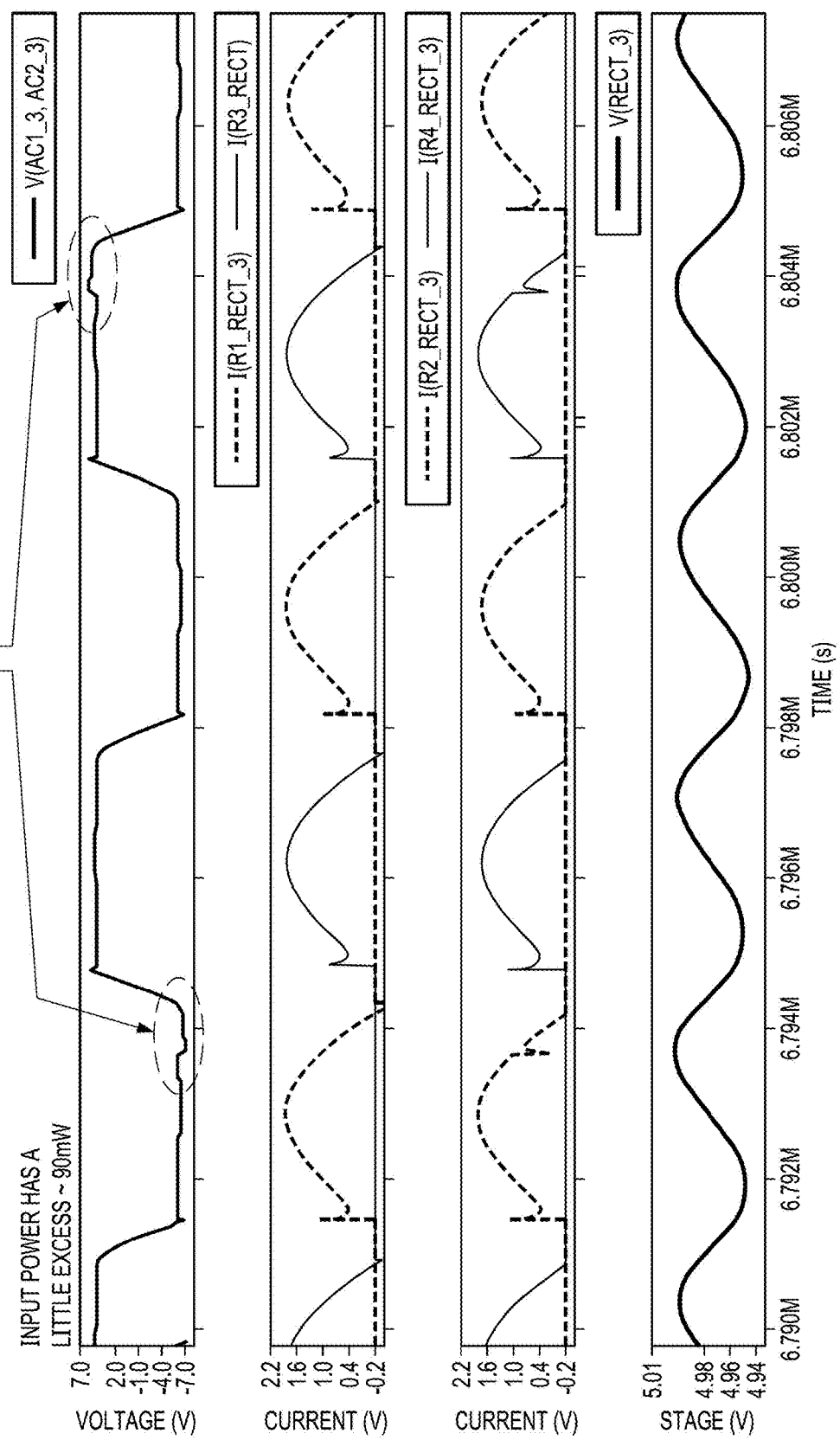
FIG. 13 is a timing diagram showing voltages of the wireless power transmission system of FIG. 2 in operation, when the feedback loop is controlling the bridge rectifier to perform low-side PWM based in-phase serial voltage regulation.
Figure 13B:
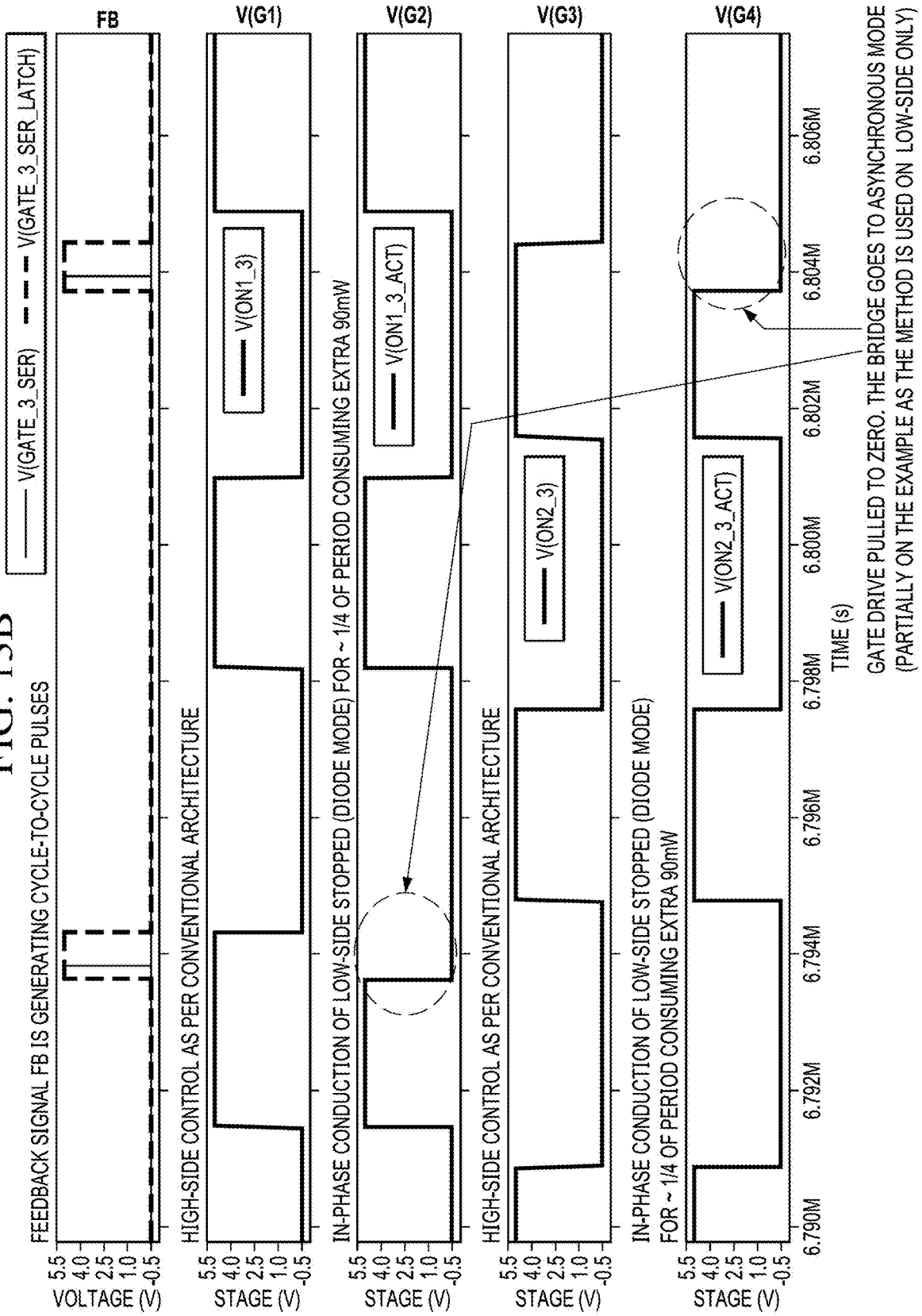

A simple example of this technique as compared to the non-PWM in-phase serial voltage rectification technique can be seen in the traces of FIGS. 12-13, where it can be seen that here the feedback signal FB is digitized, that the gate voltage G1 is maintained as fully high during Phase A, and that the gate voltage G2 is pulled low approximately halfway through Phase A to increase the drain to source resistance of the transistor M2 to increase power dissipation. Note that as shown, spikes may occur in the gate voltage G2 being modulated, and these spikes may be filtered by the control circuitry 24, such as by using a debouncing function.

Figure 14:
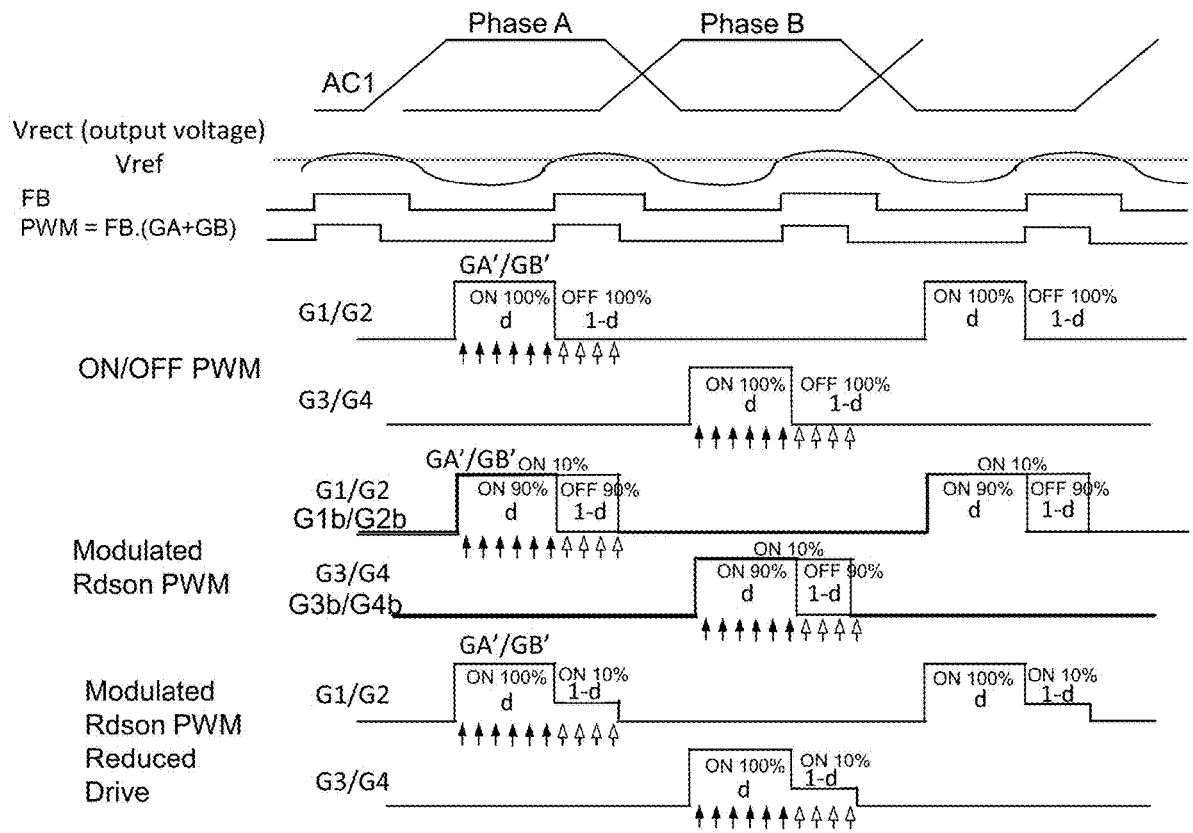
FIG. 14 are timing diagrams showing the three different PWM control techniques available when the feedback loop is controlling the bridge rectifier to perform low-side PWM based in-phase serial voltage regulation.

In the example of FIG. 13, the gate voltages G2 and G4 of the low side transistors (M2 and M4) are modulated while the gate voltages G1 and G3 of the high side transistors (M1 and M3) are not. However, both low side and high side transistors may be modulated. As shown in FIG. 14, during phase A, so as to provide for voltage regulation, the gate voltages G1 and G2 are fully turned off (in response to the feedback signal FB rising, which as can be seen, occurs when Vrect exceeds Vref) earlier than they would otherwise be using a conventional wireless power transmission system, maintaining the output voltage Vrect at a desired level and dissipating excess power. Similarly, during phase B, so as to provide for voltage regulation, the gate voltages G3 and G4 are fully turned off (in response to the feedback signal FB rising) earlier than they would otherwise be using a conventional wireless power transmission system, maintaining the output voltage Vrect at a desired level and dissipating excess power.

Figure 15:
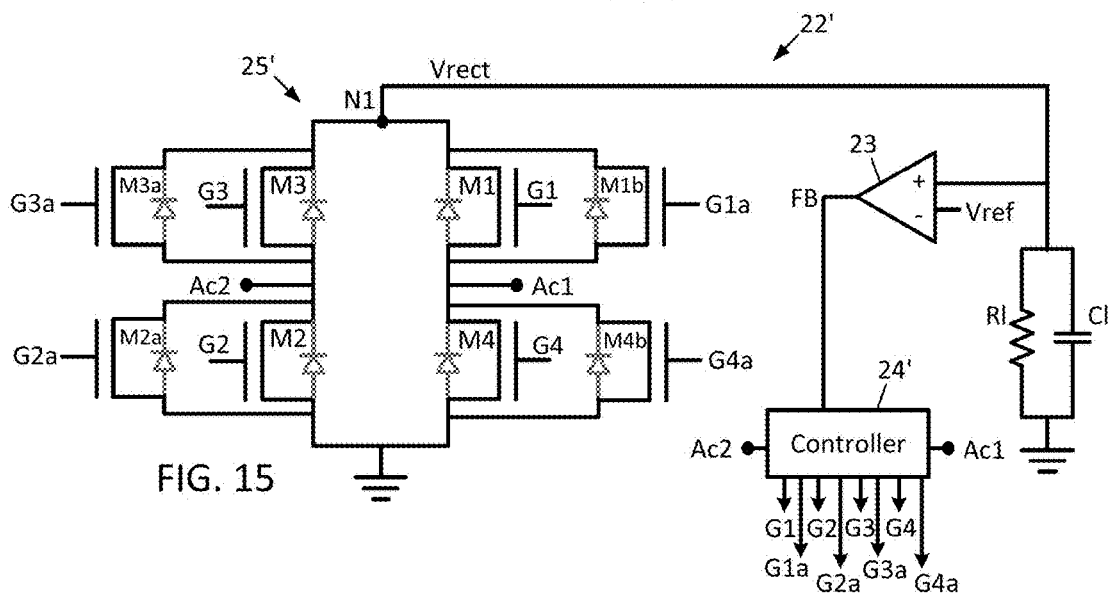
FIG. 15 is a schematic diagram of an alternate configuration for the regtifier of FIG. 2.

A second way in which to operate the gates of the transistors from among M1-M4 to be regulated involves modifying the regtifier itself to produce a modified regtifier 25'. As can be seen in FIG. 15, each transistor of the regtifier 25' has been divided into two parallel coupled transistors having different W/L ratio as one another so as to provide different resistivities when controlled individually, with the sum of the widths and lengths of the transistors of each parallel coupled pair being equal to the width and length of the corresponding transistor of the regtifier 25, so as to provide a total the same as the regtifier 25 resistivity when fully ON. Therefore, the regtifier 25 is comprised of: n-channel transistors M1 and M1b coupled in parallel, with their drains coupled to node N1, their sources coupled to node Ac1, and their gates respectively coupled to receive the gate voltages G1 and G1a; n-channel transistors M4 and M4b coupled in parallel, with their drains coupled to node Ac1, their sources coupled to ground, and their gates respectively coupled to receive the control signals M4 and M4a; n-channel transistors M3 and M3a coupled in parallel, with their drains coupled to node N1, their sources coupled to node Ac2, and their gates respectively coupled to receive the gate voltages G3 and G3a; and n-channel transistors M2 and M2a coupled in parallel, with their drains coupled to node Ac2, their sources coupled to ground, and their gates respectively coupled to receive the gate voltages G2 and G2a.

The area of the transistor M1 in the regtifier 25' is 90% of the area of the transistor M1 in the regtifier 25 and the area of the transistor M1a in the regtifier 25' is 10% of the area of the transistor M1 in the regtifier 25; the area of the transistor M2 in the regtifier 25' is 90% of the area of the transistor M2 in the regtifier 25 and the area of the transistor M2a in the regtifier 25' is 10% of the area of the transistor M2 in the regtifier 25; the area of the transistor M3 in the regtifier 25' is 90% of the area of the transistor M3 in the regtifier 25 and the area of the transistor M3a in the regtifier 25' is 10% of the area of the transistor M3 in the regtifier 25; and the area of the transistor M4 in the regtifier 25' is 90% of the area of the transistor M4 in the regtifier 25 and the area of the transistor M4a in the regtifier 25' is 10% of the area of the transistor M4 in the regtifier 25. Note that the relative sizes of the transistors M1-M4 described above may change, and that, for example, the transistors M1-M4 of the regtifier 25' may be 80% of the area of the transistors M1-M4 of the regtifier 25, while the transistors M1a-M4a of the regtifier 25' may be 20% of the area of the transistors M1-M4 of the regtifier 25.

Together with this, the control circuitry 24' is also modified, as shown in FIG. 15, to output the gate voltages G1a-G4a in addition to the gate voltages G1-G4.

Figure 16B:
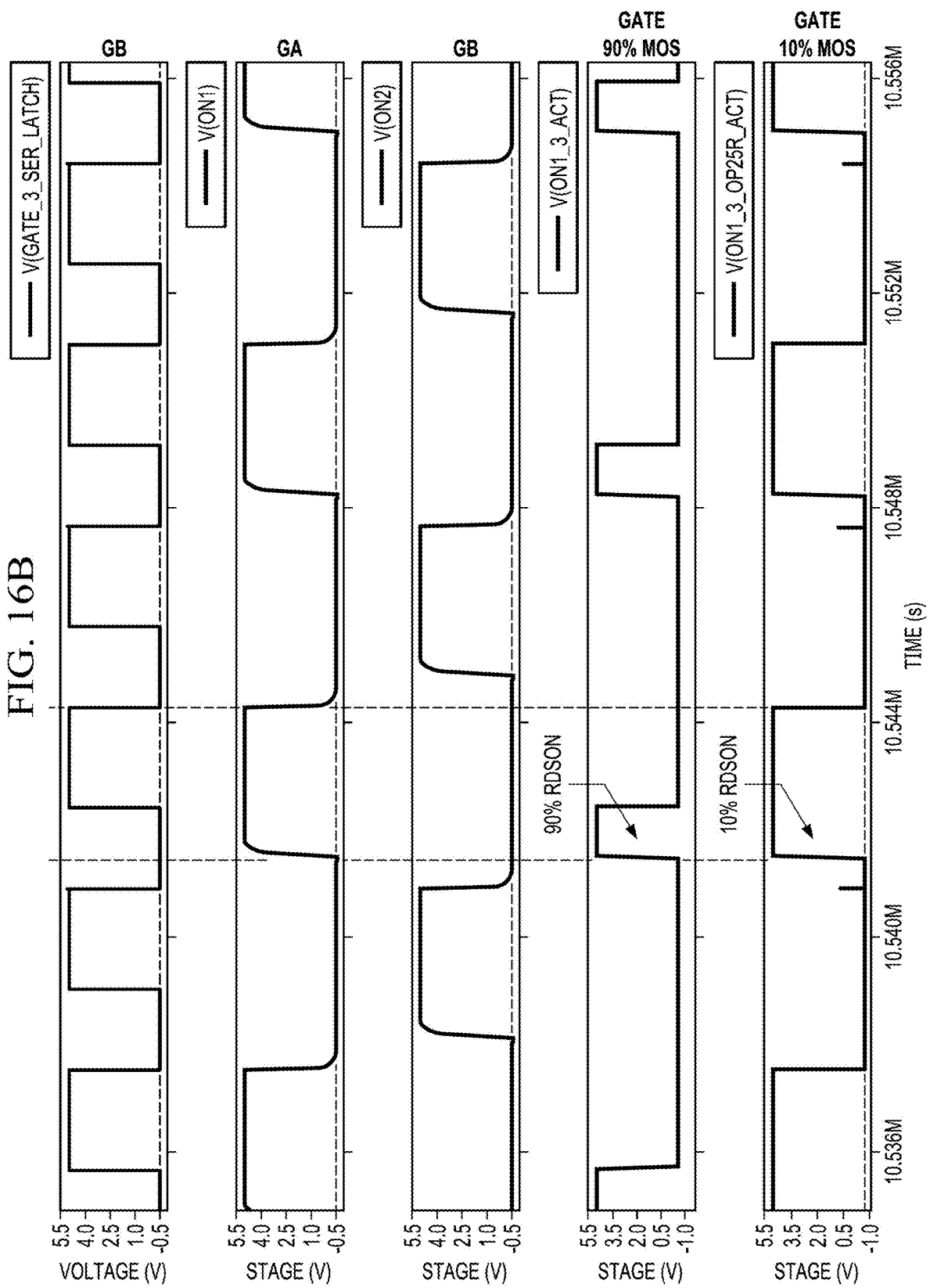
FIG. 16 is a timing diagram showing one of the PWM control techniques available when the feedback loop is controlling the bridge rectifier to perform low-side PWM based in-phase serial voltage regulation using the regtifier of FIG. 16.

With this modified regtifier 25', as can be seen in FIGS. 14 and 16, during phase A, the gate voltages G1a and G2a are fully high for the entire phase, while the gate voltages G1 and G2 are fully high for a first portion of the phase and then fall low for the remainder of the phase. Similarly, during phase B, the gate voltages G3a and G4a are fully high for the entire phase, while the gate voltages G3 and G4 are fully high for a first portion of the phase and then fall low for the remainder of the phase. Using this technique helps avoid the inducing of noise that can result when a transistor that is fully on is turned off, since the transistors G1a and G2a remain on for the remainder of Phase A when the transistors G1 and G2 are turned off, and since the transistors G3a and G4a remain on for the remainder of Phase B when the transistors G3 and G4 are turned off.

A third way in which to operate the gates of the transistors from among M1-M4 to be regulated involves switching the gate voltages G1-G4 between first and second pre-determined constant drive voltages. As shown in FIG. 14 during phase A, the gate voltages G1 and G2 are fully high (the first constant drive voltage) for a first portion of the phase and then fall to the second constant drive voltage for the remainder of the phase. Similarly, during phase B, the gate voltages G3 and G4 are fully high (the first constant drive voltage) for a first portion of the phase and then fall to the second constant drive voltage for the remainder of the phase. The first portion of Phases A and B may be about 90% of the total elapsed time of those phases, while the second portion of Phases A and B may be the remainder of the total elapsed time of those phases.

It is to be noted that while the first way of operating the gates in FIG. 14 may induce noise that can result when a transistor is turned off, while the second way may lead to high current density in the small device (10%) during repeated lapses of time, the third way has the benefit of simplicity of the digital approach as it uses only two drive levels, but also allows minimization of the current density in the devices as would the analog method.

Note that the feedback loop formed by the amplifier 23 and the control circuitry 24 may be operated at a sufficient speed so that it reacts on a cycle-to-cycle basis, enabling the control circuitry 24 to alter the generation of the gate voltages G1-G4 on a cycle to cycle basis when performing in-phase serial voltage regulation. This feedback technique can be observed in the graph of FIG. 9, where the feedback signal FB is generated during each phase, enabling the gate voltages G1-G4 to be altered on a cycle-to-cycle basis.

In some instances, however, the feedback loop formed by the amplifier 23 and the control circuitry 24 may be operated slowly as compared to the frequency of the signal being transmitted by the transmitter 21. This way, the generation of the feedback signal FB is not on a cycle-to-cycle basis, and instead the generation of the feedback signal FB is filtered, allowing the gates of the transistors M1-M4 to be driven pseudo-statically.

C. Operation Using Anti-Phase Parallel Voltage Regulation

Operation of the wireless power transmission system 20 under an anti-phase parallel voltage regulation scheme controlled by the control circuitry 24 is now described.

Figure 6:
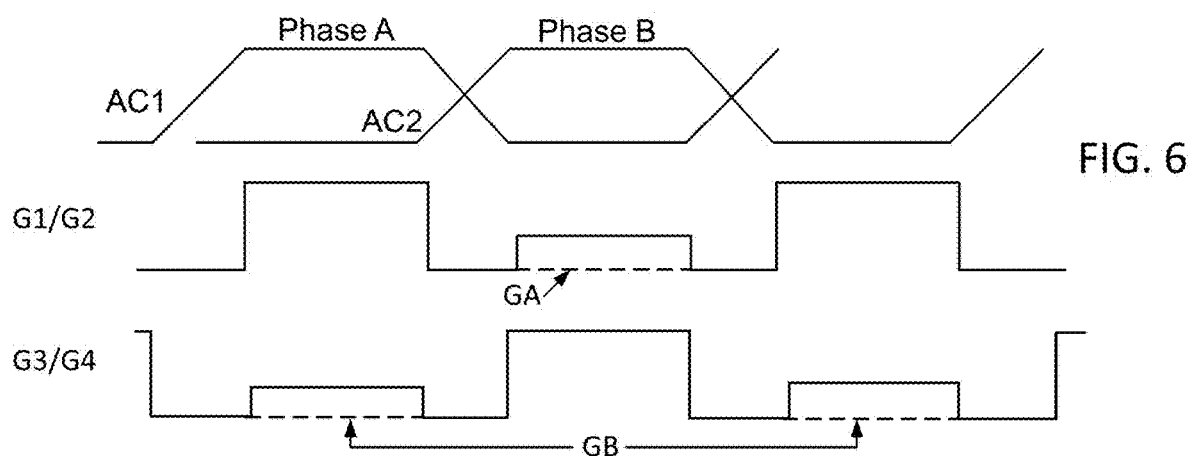
FIG. 6 is a timing diagram showing voltages of the wireless power transmission system of FIG. 2 in operation, when the feedback loop is controlling the bridge rectifier to perform anti-phase parallel voltage regulation.

Shown in the graph of FIG. 6 are waveform traces of the signals at the nodes Ac1 and Ac2. Notice that when the signal at Ac1 is high, it is labeled as Phase A, that when the signal at Ac2 is high, it is labeled as Phase B, and that the signals at Ac1 and Ac2 are 180° out of phase with one another.

During Phase A, the gate voltages G1 and G2 are driven, fully turning on transistors M1 and M2, while during Phase B, the gate voltages G3 and G4 are driven, instead fully turning on transistors M3 and M4. Conventionally, the transistors from among M1-M4 not turned on during a given phase are fully turned off.

However, with the anti-phase parallel voltage regulation scheme, when the incoming power delivered by the regtifier 25 to the load is greater than the amount of load consumed by the load, the voltage Vrect at node N1 rises to be greater than the reference voltage Vref, causing the feedback signal FB to rise. When the feedback signal FB rises, the control circuitry 24 modulates the appropriate gate voltages from among G1-G4 to turn on one or more of the two transistors M1 and M2, or M3 and M4 that would conventionally be off during the current phase and place those transistors in the saturation region of operation. The result is that these transistors M1 and M2, or M3 and M4 that are additionally turned on draw a moderate current but have a large drain to source voltage hence inducing sufficient power losses to consume the excess incoming power.

In greater detail, as shown in FIG. 6, in phase A, the gate voltages G1 and G2 are high to turn transistors M1 and M2 fully on and maintain those transistors fully on during phase A. However, here, the gate voltages G3 and G4 are also driven, albeit at a lesser voltage magnitude than the gate voltages G1 and G2, to thereby sufficiently turn on transistors M3 and M4 with a drain to source voltage and associated impedance sufficient to dissipate additional power over conventional operation. Similarly, in phase B, the gate voltages G3 and G4 are high to turn transistors M3 and M4 fully on and maintain those transistors fully on during Phase B. However, here, the gate voltages G1 and G2 are also driven, albeit at a lesser voltage magnitude than the gate voltages G3 and G4, to thereby sufficiently turn on transistors M1 and M2 with a drain to source voltage and associated impedance and drain to source current sufficient to dissipate additional power over conventional operation.

Figure 7:
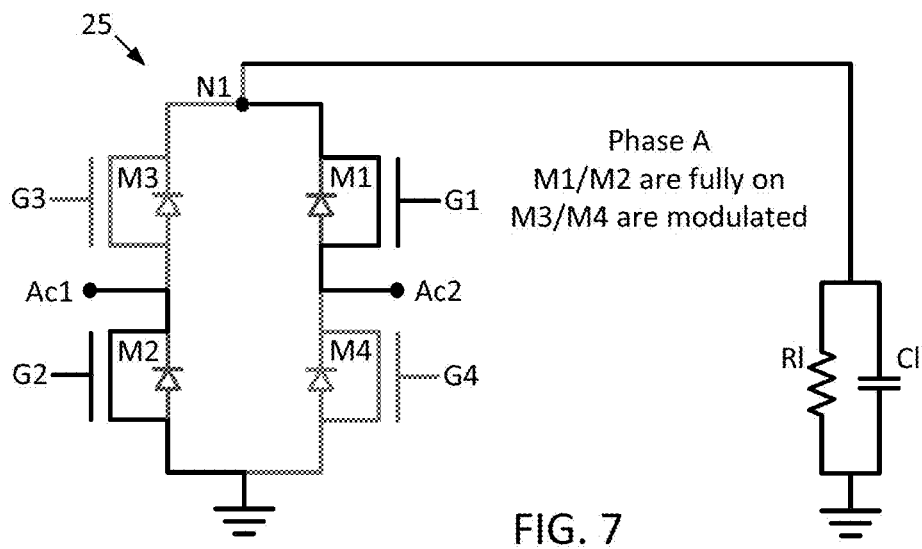
FIG. 7 is a schematic block diagram of the wireless power transmission system of FIG. 2 showing its operation during phase A of the anti-phase parallel voltage regulation of FIG. 6.
Figure 8:
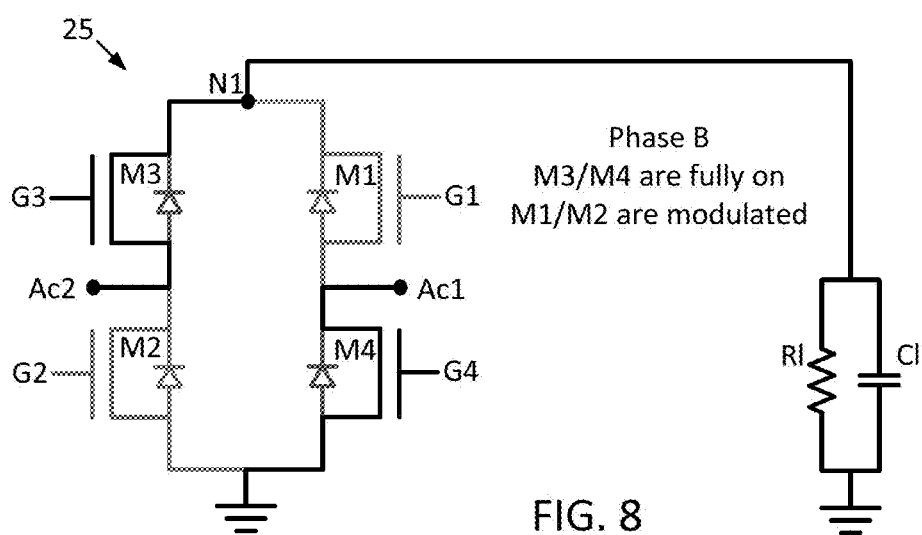
FIG. 8 is a schematic block diagram of the wireless power transmission system of FIG. 2 showing its operation during phase B of the anti-phase serial voltage regulation of FIG. 6.

This operating scheme is referred to as anti-phase parallel regulation because the transistors M1-M4 that are conventionally fully on during a given phase remain fully on while the transistors from among M1-M4 that are conventionally off during the given phase are turned on enough to dissipate the excess power not consumed by the load, and because, as shown in FIGS. 7-8, the power dissipation is achieved by increasing the conductivity of the elements and creating an additional current path in devices which are OFF in conventional operation and which are actually in parallel with the main current path while turned ON when operating using the described method.

Note that during Phase B, the gate voltages G1 and G2 need not both be modulated to turn on their respective transistors M1 and M2 in the linear mode of operation while the gate voltages G3 and G4 remain high to maintain their respective transistors M3 and M4 fully turned on, and instead only one of the gate voltages G1 or G2 can be modulated while the other gate voltage can remain off to keep its respective transistor M1 or M2 fully off.

Similarly, during Phase A the gate voltages G3 and G4 need not both be modulated while the gate voltages G1 and G2 remain high to maintain their respective transistors M1 and M2 fully turned on, and instead only one of the gate voltages G3 or G4 can be modulated while the other gate voltage can remain off to keep its respective transistor M3 or M4 fully off.

Figure 10B:
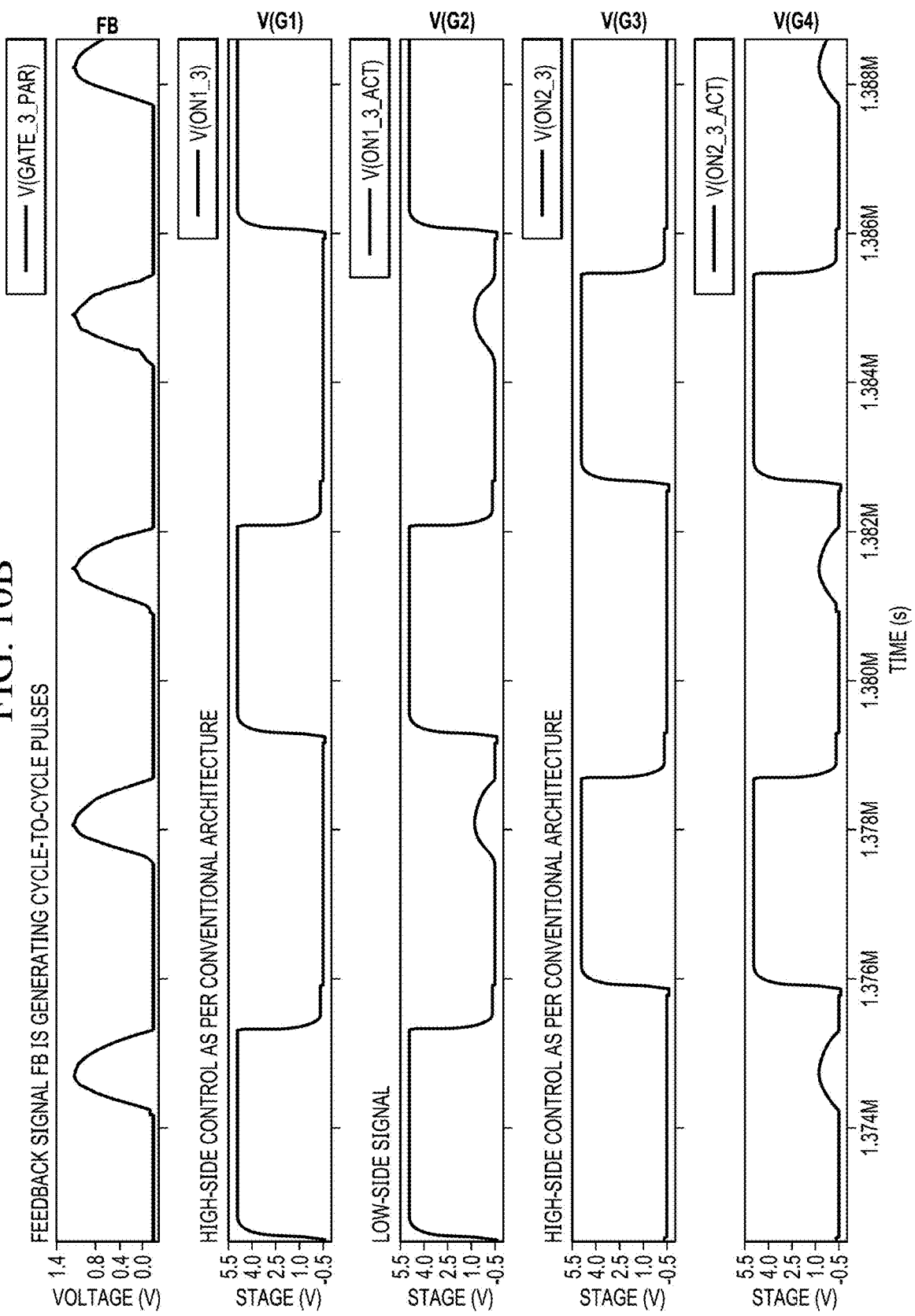
FIG. 10 is a timing diagram showing voltages of the wireless power transmission system of FIG. 2 in operation, when the feedback loop is controlling the bridge rectifier to perform low-side anti-phase parallel voltage regulation.

As an example of this form of operation where one transistor M1-M4 is modulated during the phase when it would conventionally be fully off, shown in FIG. 10 are additional waveforms of the wireless power transmission system 20 operating using anti-phase parallel regulation. Here, it can be seen that the feedback signal FB is generated during each phase, and that during Phase A, the gate voltages G1 and G2 are fully high to turn on the transistors M1 and M2, while the gate voltage G4 rises to about 1V to turn on the transistor M4 with a drain to source resistance sufficient to dissipate additional power over conventional operation. It can also be seen that during Phase B, the gate voltages G3 and G4 are fully high to turn on the transistors M3 and M4, while the gate voltage G2 rises to about 1V to turn on the transistor M2 with a drain to source resistance sufficient to dissipate additional power over conventional operation.

The anti-phase parallel voltage regulation scheme described above is particularly suited to use where the voltage output Vrect by the regtifier 25 is not relatively low and where the expected excess power to be dissipated is also not relatively low. Therefore, when operated using the anti-phase parallel voltage regulation scheme, the regtifier 25 is able to dissipate substantial excess power while maintaining the transistors of the regtifier 25 within their safe operating limits.

Note that the feedback loop formed by the amplifier 23 and the control circuitry 24 may be operated at a sufficient speed so that it reacts on a cycle-to-cycle basis, enabling the control circuitry 24 to alter the generation of the gate voltages G1-G4 on a cycle to basis when performing anti-phase parallel voltage regulation. This feedback technique can be observed in the graph of FIG. 10 where the feedback signal FB is generated during each phase, enabling the gate voltages G1-G4 to be altered on a cycle-to-cycle basis.

In some instances, however, the feedback loop formed by the amplifier 23 and the control circuitry 24 may be operated slowly as compared to the frequency of the signal being transmitted by the transmitter 21. This way, the generation of the feedback signal FB is not on a cycle-to-cycle basis, and instead the generation of the feedback signal FB is filtered, allowing the gates of the transistors M1-M4 to be driven pseudo-statically.

D. Combination of In-Phase Serial Voltage Regulation and Anti-Phase Parallel Voltage Regulation Since the in-phase serial voltage regulation described above involves modulating the gate voltage of one or both of the transistors conventionally on during a given phase, and since the anti-phase parallel voltage regulation described above involves modulating the gate voltage of one or both of the transistors conventionally off during that given phase, it should be appreciated that these two techniques may be utilized simultaneously. Therefore, the gate voltage of one or two transistors of the regtifier 25 may be modulated according to the in-phase serial regulation scheme, while the gate voltage of one or two other transistors of the regtifier 25 may be modulated according to the anti-phase parallel regulation scheme, and while non-modulated transistors of the regtifier 25 are operated conventionally.

In addition, in some cases, the in-phase serial voltage regulation scheme and the anti-phase parallel voltage regulation scheme may be used separately. For example, the in-phase serial voltage regulation scheme may be used during one phase and the anti-phase parallel voltage regulation scheme may be used during the following phase.

As another example of the combination of the in-phase serial voltage regulation and the anti-phase parallel voltage regulation, the in-phase serial voltage regulation scheme may be used for a given number of phases (e.g., for one phase A and the successive phase B) and then the anti-phase parallel voltage regulation scheme may be used for a given number of phases (e.g., for the next phase A and the successive phase B).

As another example of the combination of the in-phase serial voltage regulation and the anti-phase parallel voltage regulation, the in-phase serial voltage regulation scheme may be used on one or both of the high side transistors (transistors M1 and M3) while the anti-phase parallel voltage regulation scheme may be used on one or both of the low side transistors (transistors M2 and M4), or vice versa.

As yet another example, which of the in-phase serial voltage regulation and the anti-phase parallel voltage regulation schemes is used may be switched depending upon the extra power to be dissipated. The gate voltages G1-G4 may be generated so as to operate the regtifier 25 using the in-phase serial voltage regulation scheme when the extra power to be dissipated is below a certain threshold, and the gate voltages G1-G4 may then switch to being generated so as to operate the regtifier 25 using the anti-phase serial voltage regulation scheme.

E. Control Signal Generation and Feedback Loop

Figure 19:
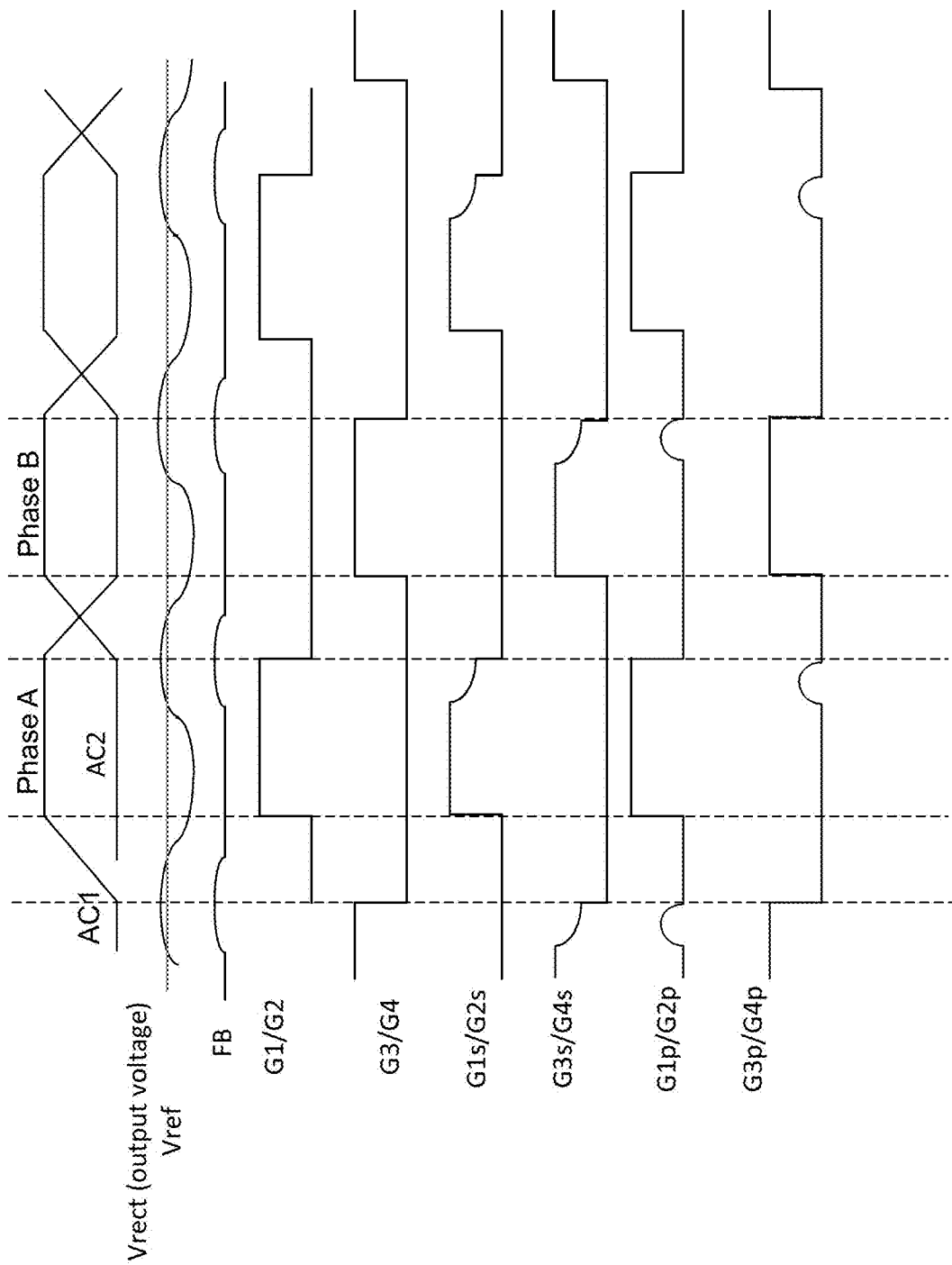
FIG. 19 is a timing diagram showing voltages of the wireless power transmission system of FIG. 2 in operation, when the feedback loop is controlling the bridge rectifier to perform in-phase serial voltage regulation as well as anti-phase parallel voltage regulation.

Now described with reference to FIGS. 17 and 19 is the control circuitry 24. First, the generation of the control signals GA and GB will be described, and thereafter, the generation of the gate voltages for the transistors M1-M4 from the gate voltages GA and GB will be described.

The control circuitry 24 includes a hysteretic comparator 51 having a non-inverting terminal coupled to node Ac1, an inverting terminal coupled to ground, and an output which produces GA.

The control circuitry 24 includes a hysteretic comparator 54 having a non-inverting terminal coupled to node Ac2, an inverting terminal coupled to ground, and an output which produces GB.

Figure 17A:
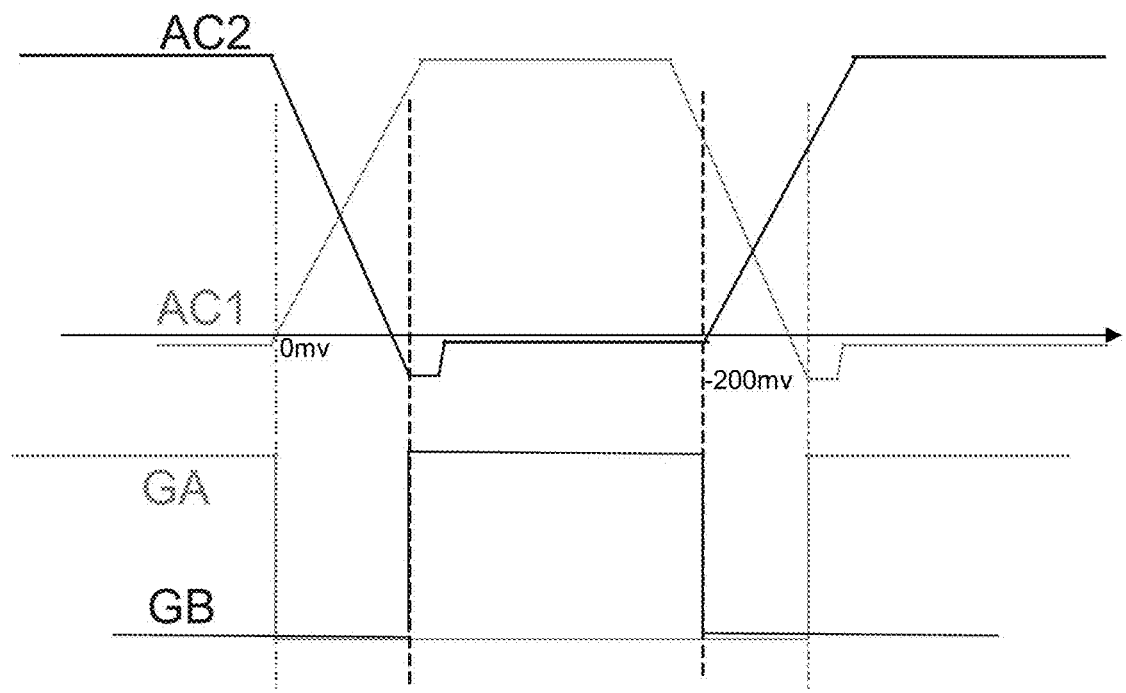
FIG. 17a is a timing diagram of the AC1 and AC2 signals and associated produced GA and GB signals within the controller of FIG. 2.
Figure 17B:
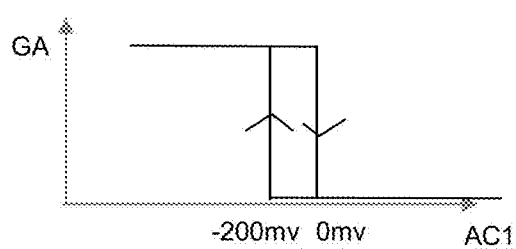
FIG. 17b is an output/input transfer function of a hysteretic comparator used within the controller of FIG. 2 for producing the GA and GB signals.
Figure 17C:
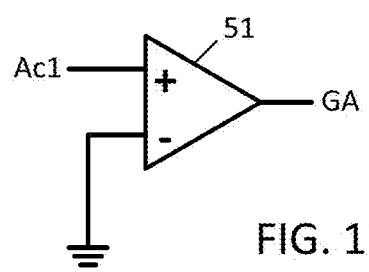
FIG. 17c is a schematic of a hysteretic comparator used for producing the GA signal.
Figure 17D:
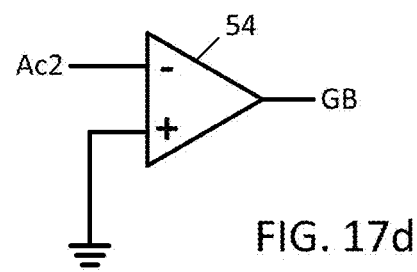
FIG. 17d is a schematic of a hysteretic comparator used for producing the GB signal.

Referring to FIG. 17a, the operation of the control circuitry 24 when generating the control voltages GA and GB is therefore that when the AC signal at node Ac1 rises to become greater than the first threshold (0 mV in this example) of the hysteretic comparator 51 (referring to FIG. 17c), the output GA of the comparator 51 is pulled low. Similarly, when the AC signal at node Ac2 falls (which occurs when the AC signal at node Ac1 rises) and is less than the second threshold (−200 mV in this example) of the hysteretic comparator 54 (referring to FIG. 17d), the output GB of the comparator 54 is pulled high.

Conversely, when the AC signal at node Ac1 falls and as a result is less than the second threshold of the hysteretic comparator 51, the output GA of the comparator 51 is pulled high. Similarly, when the AC signal at node Ac2 rises to become greater than first threshold of the hysteretic comparator 54, the output of the comparator 54 is pulled low.

Figure 18A:
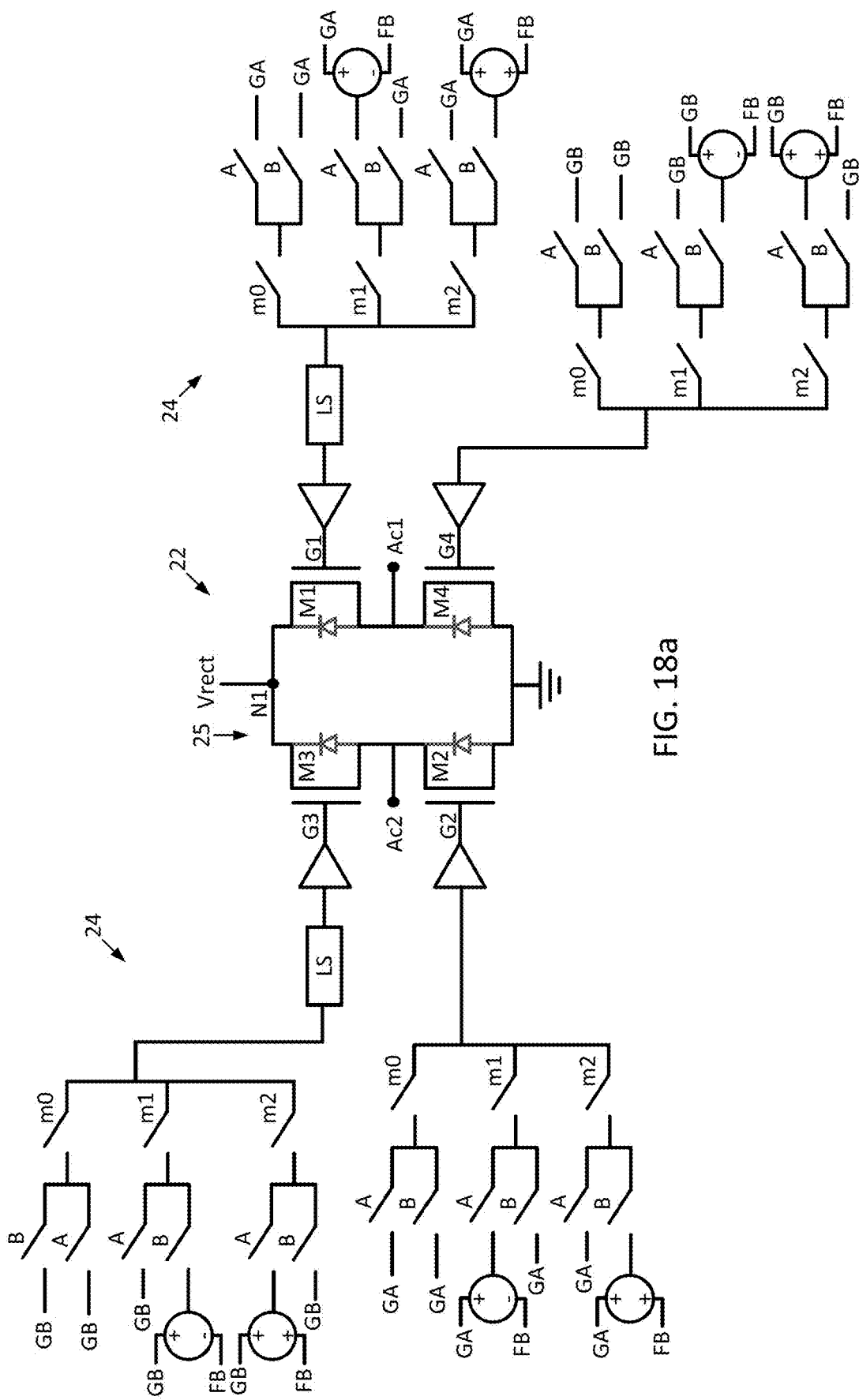
FIG. 18a is a schematic diagram illustrating mode selection circuitry within the controller of FIG. 2 for switching the regtifier of FIG. 2 between in-phase serial voltage regulation and anti-phase parallel voltage regulation.

Now referring to FIGS. 18a-19, the remainder of the control circuitry 24 is described for the cases where PWM control of the transistor gates are not used.

It is to be noted that as a general practice for low-side drive techniques, the signals for driving the gates of M2 and M4 are buffered. Also, it is to be noted that as a general practice for high-side drive techniques, the signals for driving the gates M1 and M3 are level shifted and buffered. For sake of simplification the following description will assume that GA, GB and any composite signal derived from GA, GB, FB are directly coupled to the gates, while in actual implementation buffer and level shifting technique are to be used consistently with the above mentioned techniques for low-side and high-side driving techniques.

When switches m0 are closed, indicating that the regtifier 25 is to operate as a standard rectifier, the control signal GA is coupled to the gates of transistors M1 and M2 as gate voltages G1 and G2 regardless of phase, and the control signal GB is coupled to the gates of transistors M3 and M4 as gate voltages G3 and G4 regardless of phase. Therefore, during phase A, the transistors M1 and M2 are fully turned on while the transistors M3 and M4 are fully turned off, and during phase B, the transistors M3 and M4 are fully turned on while the transistors M1 and M2 are fully turned off.

When switches m1 are closed, indicating that the regtifier 25 is to operate so as to perform in-phase serial voltage regulation, in phase A: the feedback voltage FB is subtracted from the control signal GA, and the result is coupled to the gate of the transistor M1 as gate voltage G1; the feedback voltage FB is subtracted from the control signal GA, and the result is coupled to the gate of the transistor M2 as gate voltage G2; the control signal GB is coupled to the gate of the transistor M3 as gate voltage G3; and the control signal GB is coupled to the gate of the transistor M4 as gate voltage G4. In phase B: the feedback voltage FB is subtracted from the control signal GB, and the result is then coupled to the gate of the transistor M3 as gate voltage G3; the feedback voltage FB is subtracted from the control signal GB, and the result is then coupled to the gate of the transistor M4 as the gate voltage G4; the control signal GA is coupled to the gate of the transistor M1 as gate voltage G1; and the control signal GA is coupled to the gate of the transistor M2 as gate voltage G2. Therefore, during phase A, the transistors M3 and M4 are fully off, while the gate voltages of the transistors M1 and M2 are reduced by the feedback voltage FB to thereby increase the drain to source resistances of the transistors M1 and M2 sufficiently to dissipate excess power. Similarly, during phase B, the transistors M1 and M2 are fully off, while the gate voltages of the transistors M3 and M4 are reduced by the feedback voltage FB to thereby increase the drain to source resistances of the transistors M3 and M4 sufficiently to dissipate excess power.

When the switches m2 are closed, indicating that the regtifier 25 is to operate so as to perform anti-phase parallel voltage regulation, in phase A: the voltage FB is added to the control signal GB, and the result is then coupled to the gate of the transistor M3 as gate voltage G3; the voltage FB is added to the control signal GB, and the result is then coupled to the gate of the transistor M4 as gate voltage G4; the control signal GA is coupled to the gate of the transistor M1 as gate voltage G1; and the control signal GA is coupled to the gate of the transistor T2 as gate voltage G2. In phase B: the voltage FB is added to the control signal GA, and the result is coupled to the gate of the transistor M1 as gate voltage G1; the voltage FB is added to the control signal GA, and the result is coupled to the gate of the transistor M2 as gate voltage G2; the control signal GB is coupled to the gate of the transistor M3 as gate voltage G3; and the control signal GB is coupled to the gate of the transistor M4 as gate voltage G4. Therefore, during phase A, the transistors M1 and M2 are fully on, while the gates of the transistors M3 and M4 are driven sufficiently cause dissipation of excess power by transistors M3 and M4 but not sufficiently to impede rectification. Similarly, during phase B, the transistors M3 and M4 are fully on, while the gates of the transistors M1 and M2 are driven sufficiently cause dissipation of excess power by transistors M1 and M2 but not sufficiently to impede rectification.

Figure 18B:
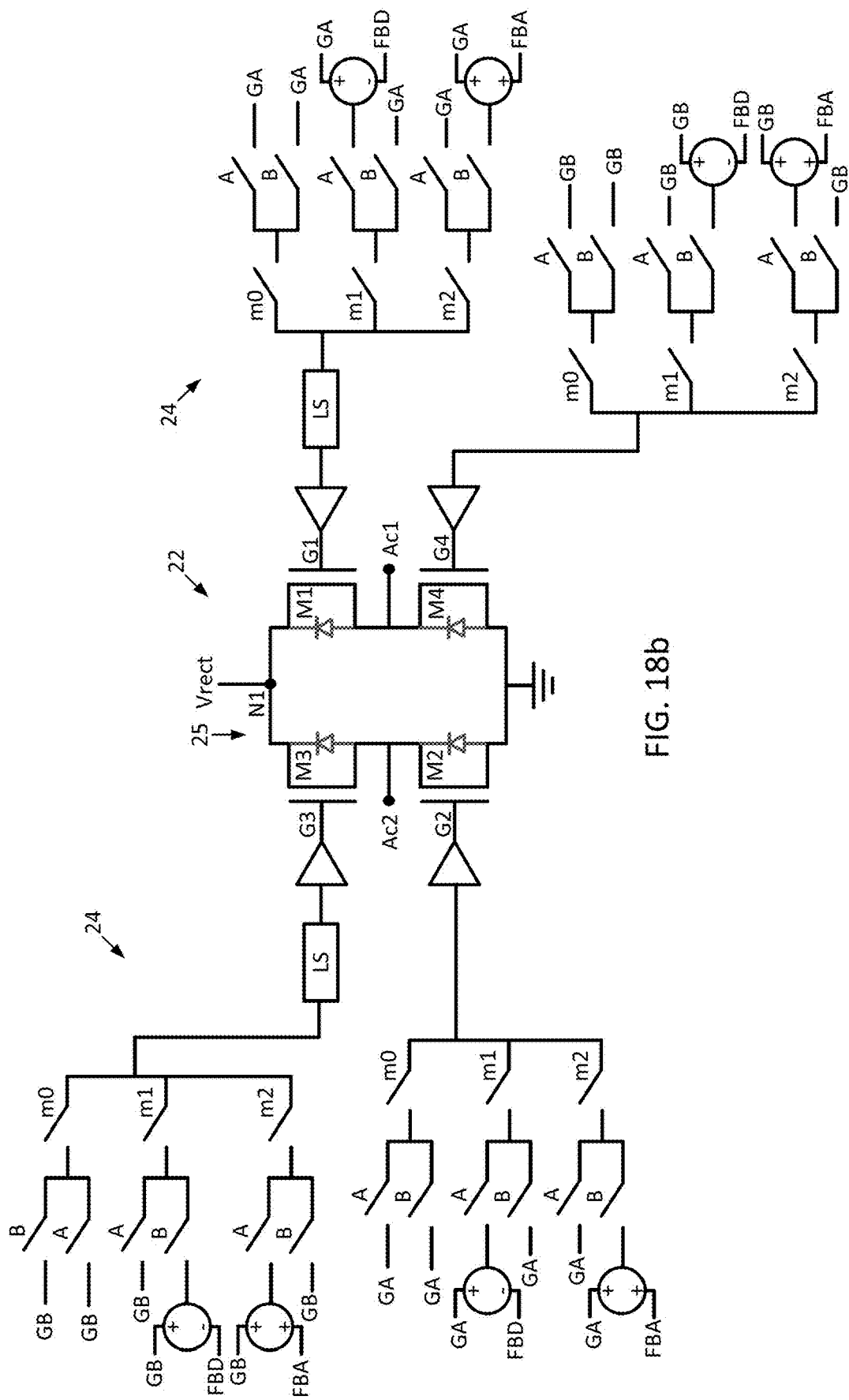
FIG. 18b is a schematic diagram illustrating mode selection circuitry within the controller of FIG. 2 for switching the regtifier of FIG. 2 between in-phase serial voltage regulation and anti-phase parallel voltage regulation and supporting PWM based in-phase serial voltage regulation.
Figure 18C:
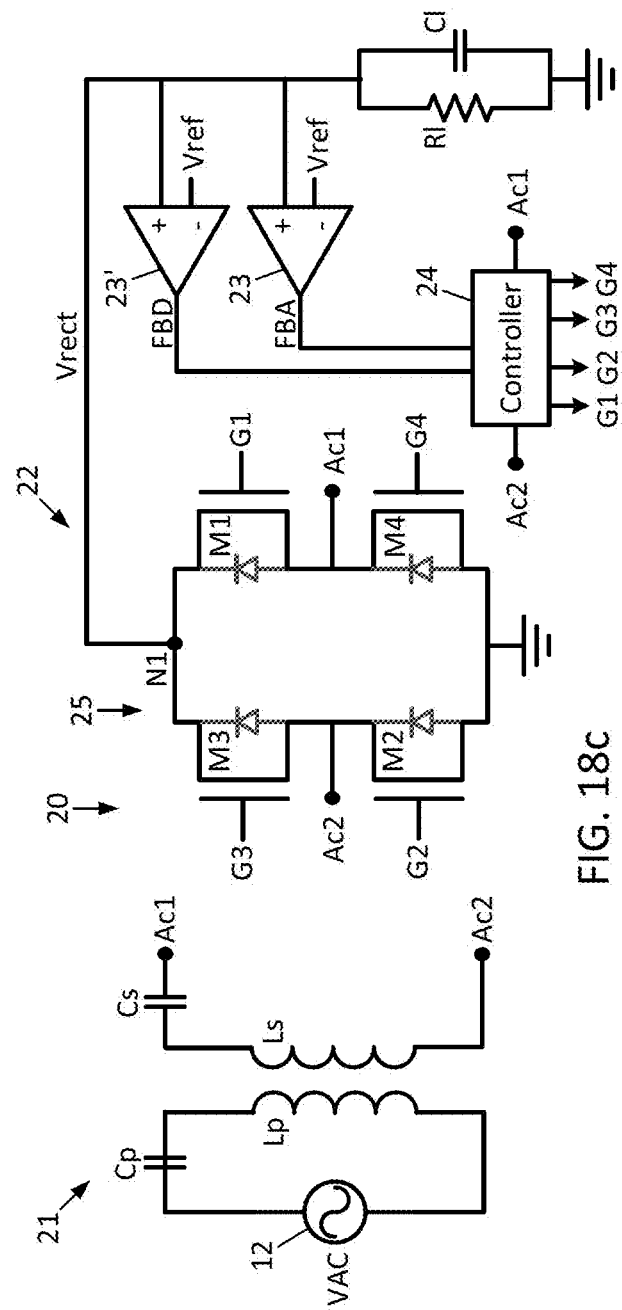
FIG. 18c is a schematic diagram illustrating the presence of an amplifier and a comparator as feedback loops.

Now referring to FIG. 18b and FIG. 18c, the remainder of the control circuitry 24 is described for the cases where PWM control of the transistor gates are used as per first and second ways of operating the gates in FIG. 14. The feedback signal FB as per FIG. 18a has been split in two, with FBA being the output of the feedback amplifier 23 named FB on FIG. 2—) and FBD being the output of the digitized feedback provided by a comparator 23' and generating signal accordingly to timing diagrams as per FIG. 12. During operation FBD may take two levels, noted FBD_H and FBD_L. Assume now that the drive strength of GA, GB is VDD, the signal GA-FBD (resp. GB-FBD) will provide two levels VDD-VGH and VDD-VGL. Therefore, in the case where VGH=VDD and VGL=0 are used, the signal GA-FBD (resp. GB-FBD) will provide two levels of drive strength, 0 and VDD, so as to drive according to the first way of operating the gates on FIG. 14.

Now, in the case where VGH=VDD−V1 and VGH=0 are used, the signal GA-FBD (resp. GB-FBD) will provide two levels of drive strength, V1 and VDD so as to drive according to the third way of operating the gates on FIG. 14.

It is to be noted that when the regtifier 25' is in serial mode controlled by m1, or in parallel mode controlled by m2, and if the FB signals (resp. FBA and FBD) are gated to zero, the regtifier 25' behaves exactly similarly to the regtifier 25' in conventional mode controlled by m0, because GA+FBD, GB+FBD, GA-FBA, GB-FBA are equal to GA, GB when FBA and FBD are gated to zero, which may occur for example when Vrect is far below the target.

Those skilled in the art will appreciate from FIG. 15 how to generalize FIG. 18b for supporting the third way of operating the gates.

Hardware and techniques for automatically switching the regtifier 25' between in-phase serial voltage regulation using PWM and anti-phase parallel voltage regulation is now described.

Figure 20:
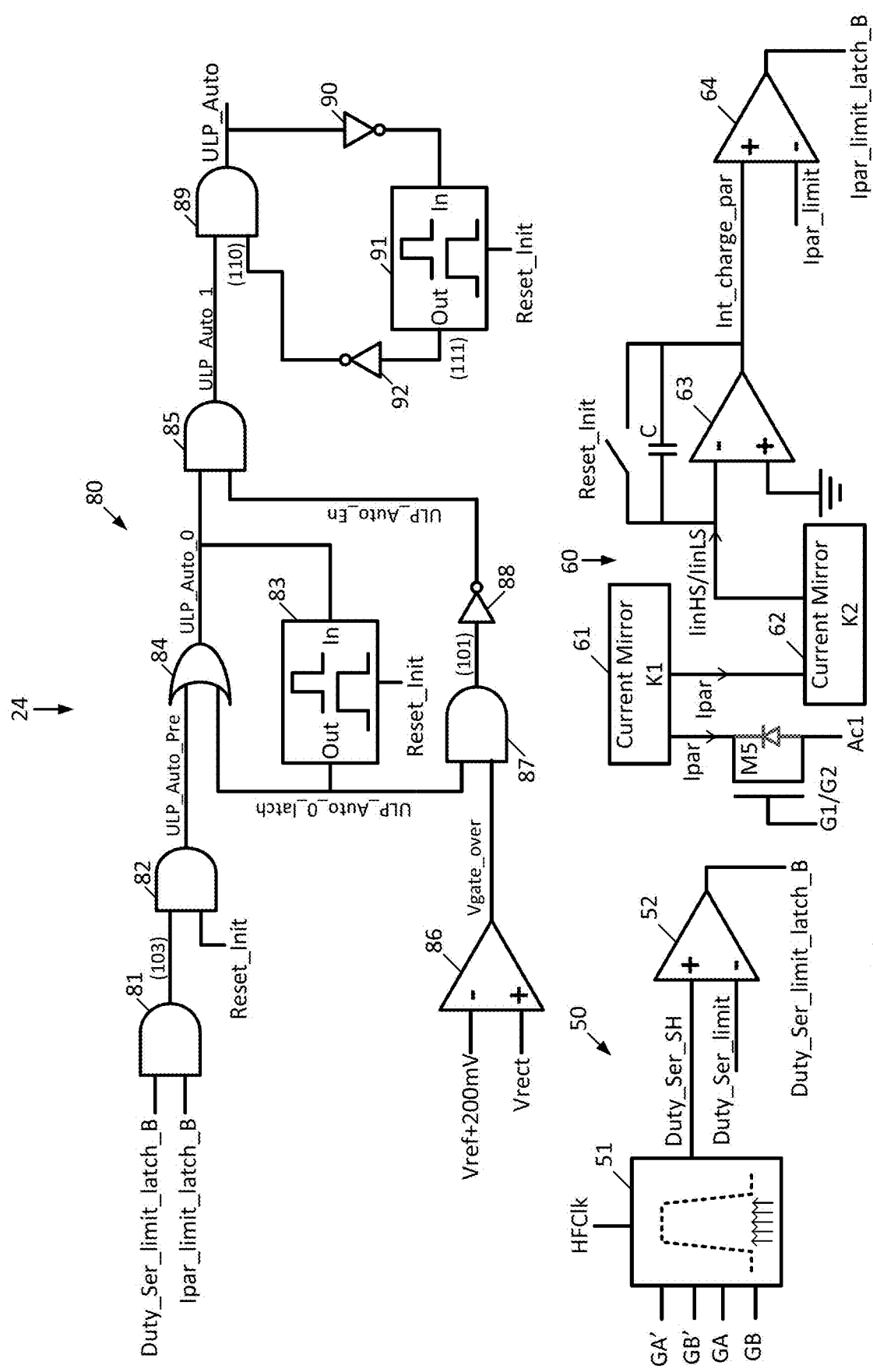
FIG. 20 is a block diagram showing components of the controller for performing on the fly mode switching between in-phase serial voltage regulation and anti-phase parallel voltage regulation.

Refer now to FIG. 20, illustrating the hardware included within the controller 24 for automatically switching the regtifier 25' between in-phase serial voltage regulation using PWM and anti-phase parallel voltage regulation. Serial monitoring circuit 50 includes a duty cycle determination circuit that utilizes counters to determine the duty cycle of control signals GA and GB (from which the gate voltages G1-G4 are determined) during performance of PWM in-phase serial voltage regulation, and therefore the duty cycle of the output of the regtifier 25', by counting a number of pulses of a high frequency counter clock HFClk within each pulse of the control signals GA and GB, by counting a number of pulses of the high frequency counter clock within each pulse of the control signals GA' and GB' (from which the gate voltages G1a-G4a are determined), and dividing the number of pulses of the high frequency clock HFClk within each pulse of control signals GA and GB by the number of pulses of the high frequency clock within each pulse of control signals GA' and GB'. The duty cycle will be referred to hereinafter as as Duty_Ser_SH; for example, if the duty cycle of the regtifier 25' is found to be 90%, then Duty_Ser_SH will be 90%. The serial monitoring circuit 50 also includes a digital comparator 52 that compares each occurrence of Duty_Ser_SH to an established duty cycle limit, Duty_Ser_limit, and latches then asserts the Duty_Ser_limit_latch_B signal when the current occurrence of Duty_Ser_SH is greater than Duty_Ser_limit. When the current occurrence of Duty_Ser_SH is less than the duty cycle limit Duty_Ser_limit, the digital comparator 52 deasserts the Duty_Ser_limit_latch_B signal. It is to be noted that Duty_Ser_limit_latch_B signal is always asserted high during anti-phase parallel mode.

The controller 24 also includes a parallel monitoring circuit 60 including an n-channel transistor M5 that is a replica of one of the transistors in the regtifier 25' (illustratively a replica of either G1 or G2) that receives the corresponding gate voltage G1 or G2 at its gate, has its source coupled to the node Ac1, and has its drain coupled to a first current mirror 61. The first current mirror 61 mirrors the current Ipar flowing through the replica transistor M5 during anti-phase parallel voltage regulation to a second current mirror 62, which in turn mirrors the current to the inverting terminal of amplifier 63 configured as an integrator as either IinHS (in the case where the transistor M5 is a replica of transistor M1 or M3) or IinLS (in the case where the transistor M5 is a replica of transistor M2 or M4). It is to be noted that the current mirror 61 can be advantageously supplied from the Vrect node, and that the power consumption by the current mirror is not critical as in any case it is contributing as part of the overall objective of consuming an excess of incoming power. As such it will be appreciated that the ratio K1 does not need to be very high and good matching performances of the mirror is doable. The inverting terminal of the integrator 63 is coupled to ground, and a capacitor C and reset switch are coupled in parallel between the inverting terminal and output of the integrator 63. The integrator 63 output is the Int_charge_par signal, which is compared to the limit current Ipar_limit by a latchable comparator 64, and the result latched by the comparator 64 and thereafter inverted by the inverter 65 to produce the Ipar_limit_latch_B signal. It is to be noted that the Ipar_limit_latch_B signal is by design always asserted high during in-phase serial mode as there is no current flowing in the anti-phase parallel regulation HW.

Mode switch control circuitry 80 includes an AND gate 81 that receives the Duty_Ser_limit_latch_B and Ipar_limit_latch_B signals, performs a logical AND operation, and produces the signal 103 as output. Given that Duty_Ser_limit_latch_B signal is always asserted high during anti-phase parallel mode and signal Ipar_limit_latch_B is by design also always asserted high during in-phase serial mode, the AND gate 81 does always have one of its two inputs which is at a logical one. The AND gate 81 is therefore the entry point of the automatic switching between the two modes.

An AND gate 82 receives the signal 104 and an initialization signal Reset_Init as input, performs a logical AND operation, and produces the ULP_Auto_Pre signal as output. An OR gate 84 receives the ULP_Auto_Pre signal from the AND gate 82 as input, and receives the ULP_Auto_0_latch signal from a non-retriggerable monostable 83 as input, performs a logical OR operation, and produces the ULP_Auto_0 signal as output. The monostable 83 receives the ULP_Auto_0 signal as input and produces the ULP_Auto_0_latch signal as output.

A comparator 86 receives the output voltage Vrect at its non-inverting terminal and the reference voltage Vref+200mv at its inverting terminal, and produces the Vgate_over signal as output. An AND gate 87 receives the Vgate_over signal and the ULP_Auto_0 signal as input, performs a logical AND operation, and generates the signal 101 as output, which is in turn inverted by the inverter 88 to produce the ULP_Auto_En signal as output. An AND gate 85 receives the ULP_Auto_0 and ULP_Auto_En signals as input, performs a logical AND operation, and generates the ULP_Auto_1 signal as output. An AND gate 89 receives the ULP_Auto_1 signal from the AND gate 85 as input, as well as the signal 110, which is the output of an inverter gate 92 which receives its input from the output 111 of a non-retriggerable monostable 91. The AND gate 89 performs a logical AND operation to produce the ULP_Auto signal as output, which is inverted by the inverter 90 and passed to the input of the monostable 91.

The non-retriggerable monostables 83 and 91 receive the initialization signal Reset_Init, which is asserted when it is desired to reset the monostables 83 and 91 to be triggerable again one time.

As will be explained, when the ULP_Auto signal is a logical one, the controller 24 generates the gate voltages G1-G4 and G1a-G4a of the transistors M1-M4 and M1a-M4a to cause the regtifier 25' to perform in-phase serial voltage regulation, and when the ULP_Auto signal is a logical zero, the controller 24 generates the gate voltages G1-G4 and G1a-G4a of the transistors M1-M4 and M1a-M4a to cause the regtifier 25' to perform anti-phase parallel voltage regulation.

Figure 21:
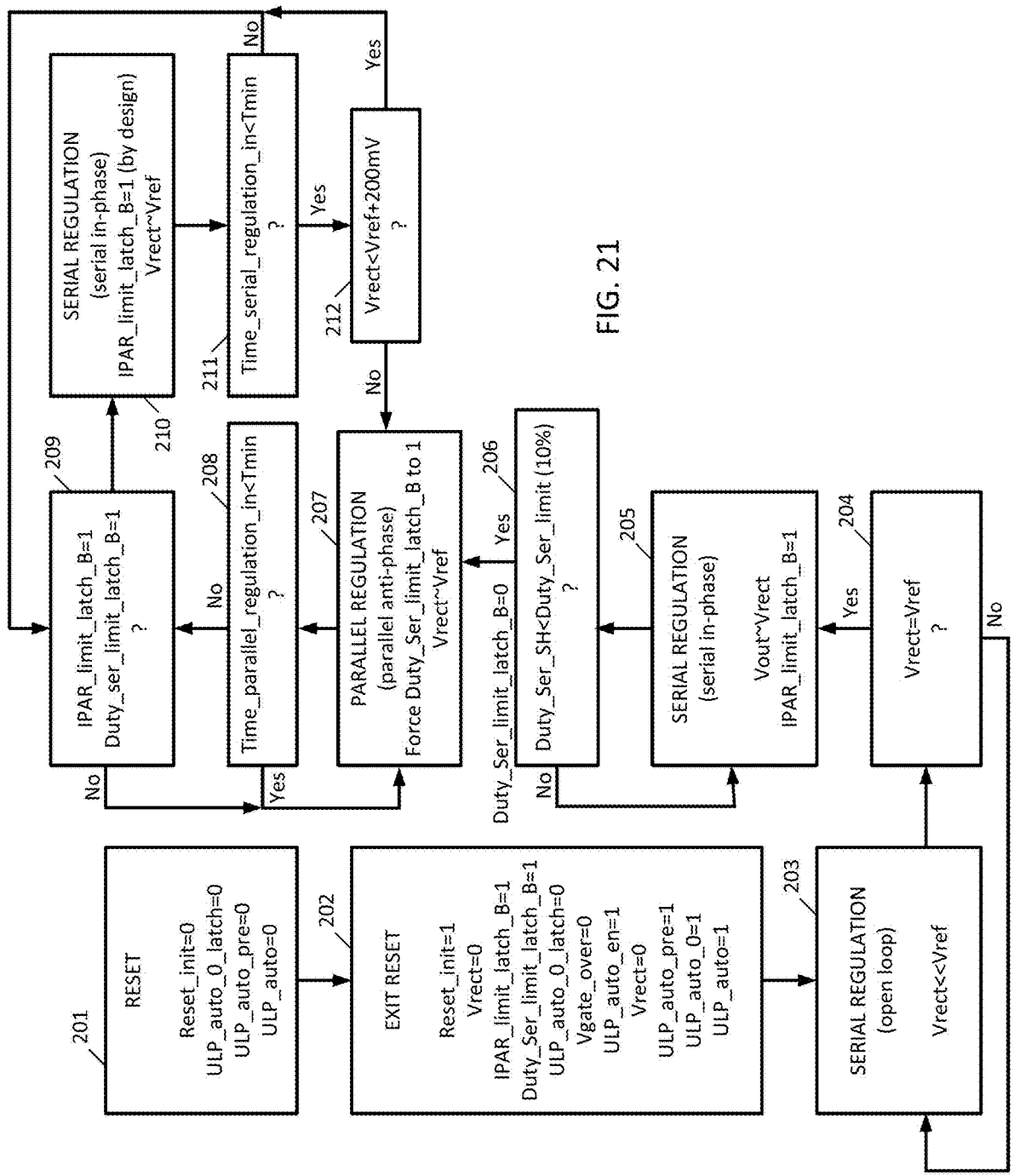
FIG. 21 is a flowchart of a method of operating the mode switching circuitry of FIG. 20 to switch the regtifier between performing in-phase serial voltage regulation and anti-phase parallel voltage regulation.

The operation of the mode switch control circuitry 80 will now be described with additional reference to FIG. 21.

At power-up and/or reset, the Reset_Init signal is set to a logical zero, resetting the monostables 83 and 91, as well as the integrator 63 (Block 201) by closing its switch. As a result, the AND gate 82 outputs the ULP_Auto_Pre signal as a logical zero and the monostable 83 outputs ULP_Auto_0_latch as a logical zero, resulting in the OR gate 84 outputting the ULP_Auto_0 signal as a logical zero. Since the ULP_Auto_0 signal is a logical zero, the AND gate 85 will output the ULP_Auto_1 signal as a logical zero, and in turn the AND gate 89 will output the ULP_Auto signal as a logical zero. It is to be noted that input 110 has no effect at this point, as ULP_Auto_1 is a logical 0. Input 110 would however hold ULP_Auto to logical 0 for a while, should ULP_Auto_1 have just transitioned from logical one to logical zero.

Next, to exit the reset, the Reset_Init signal is set to a logical one (Block 202). At this point in time, power transfer has not begun, and therefore the control signals GA, GB, GA', and GB' are zero. The result of the control signals GA, GB, GA', and GB' being zero is that the gate voltages G1-G4 and G1a-G4a are generated as being zero.

The result of G1-G4, G1a-G4b being zero is that the regtifier 25' is operating as a conventional 4 diodes rectifier in asynchronous mode, and the Vrect is free to rise under the effect of the incoming power, which in turn supplies the controller 24', which in turn generates the signals G1-G4, G1a-G4b.

At this point, and because the Vrect voltage is still low and below the target, the regtifier 25' is operating as conventional rectifier as highlighted previously, and as a first result the Duty_Ser_SH signal is high and the comparator 52 outputs Duty_Ser_limit_latch_B signal as a logical one.

As a second effect of the regtifier 25' operating as per conventional rectifier, the currents Ipar and IinHS/IinLS are zero, as no anti-phase conduction is occurring, with the result being that the amplifier 63 outputs the Int_charge_par signal as being zero. As a result of the Int_charge_par signal being zero, Ipar_limit is greater than Int_charge_par, and the comparator 64 will latch and output a logical zero, which is inverted by the inverter 65 to produce the Ipar_limit_latch_B signal at a logical one.

Since Duty_Ser_limit_latch_B and Ipar_limit_latch_B are both at a logical one, the signal 103 output by the AND gate 81 is a logical one, and since the Reset_Init signal is at a logical one, the ULP_Auto_Pre signal output by the AND gate 82 is a logical one. As a result of the ULP_Auto_Pre signal being a logical one, the ULP_auto_0 signal output by the OR gate 84 as a logical one, which in turn causes the ULP_Auto_0_latch signal to rise to a logical one, which in turn triggers the monostable 83, which in turn applies a logical one to the ULP_Auto_0_latch which remains at logical one during the duration of the monostable 83 pulse, which guarantees a logical one on ULP_Auto_0 during the duration of the pulse generated by the monostable 83. The system therefore has the capability to self-lock the ULP_Auto_0 logic to logical one during a minimum duration set by the monostable pulse duration, each time ULP_Auto_0 transitions from logical zero to logical one.

Since the output voltage Vrect will be lower than Vref, the reference voltage Vref+200 mV is larger than Vrect, resulting in the Vgate_over signal output by the comparator 86 being a logical zero, and in turn, the signal 101 output by the AND gate 87 being a logical zero and inverted by the inverter 88 to produce the ULP_Auto_En signal as being a logical one. In other words, the Vgate_over signal does not have any incidence during this phase. The relevance of the function will be explained further.

Note that since ULP_Auto was produced as a logical zero during reset, the inverter 90 outputs a logical one, causing the monostable 91 to produce a logical one at its output as signal 110. Since the ULP_Auto_0 is a logical one and since the ULP_Auto_En signal is a logical one, the ULP_Auto_1 signal output by the AND gate 85 is produced as being a logical one. Since the ULP_Auto_1 signal is a logical one and since the signal 110 is a logical one, the ULP_Auto signal at this point will be output by the AND gate 89 as a logical one.

The ULP_Auto signal being at a logical one causes the controller 23 to generate GA, GB, GA', and GB' so that on top of conventional operation of rectification of the currents induced in the secondary coil Ls, it performs in-phase serial regulation (Block 203). Initially, the output voltage Vrect will be substantially less than Vref and therefore the comparator 23 will not assert the feedback signal FB.

Operation continues in this open-loop fashion while the output voltage Vrect remains less than the reference voltage Vref (Block 204). As operation continues, the output voltage Vrect will rise. Once the output voltage Vrect becomes superior or equal to the reference voltage Vref (Block 204), the feedback signal FB is asserted by the comparator 23, and closed loop serial in-phase regulation begins (Block 205). At this point, the closed loop serial in-phase regulation using PWM continues, as described above in detail, and continues until the Duty_ser_limit_latch_B signal is pulled to a logic low (Block 206). This occurs when the duty cycle Duty_Ser_SH of the regtifier 25' falls below 10% (meaning that the Duty_Ser_SH signal falls below 10% to become lesser than Duty_Ser_limit, which is set at 10%, resulting in the comparator 52 outputting Duty_Ser_limit_latch_B as a logical zero.

Duty_ser_limit_latch_B being output as a logical zero in turn causes the signal 103 output by the AND gate 81 to become a logical zero, causing the ULP_Auto_Pre signal output by the AND gate 82 to become a logical zero, resulting in the OR gate 84 outputting the ULP_Auto_0 signal as a logical zero (because ULP_Auto_0 is a logical zero), in turn resulting in the ULP_Auto_1 signal being output by the AND gate 85 as a logical zero, and therefore the ULP_Auto signal being output by the AND gate 89 as a logical zero.

The ULP_Auto signal being output as a logical zero causes the controller 23 to generate GA, GB, GA', and GB' so as to rectify currents induced in the secondary coil Ls while performing anti-phase parallel regulation (Block 207).

It is to be noted that the transition of ULP_Auto from logical one to logical zero, after inversion by the inverter gate 90, does trigger the monostable 91, the output of which, once inverted by the inverter gate 92, secures a logical zero on input 110 and ensures that logical zero on AND gate 89 is maintained during the duration of the non-retriggerable monostable 91.

Therefore, until an elapsed time starting from the beginning of anti-phase parallel regulation becomes greater than a minimum time (Block 208), the anti-phase parallel regulation continues. If the elapsed time becomes greater than the minimum time (Block 208), but the IPAR_limit_latch_B and Duty_ser_limit_latch_B signals are not both a logical one, then ULP_Auto continues to be output as a logical zero, and anti-phase parallel regulation continues. However, if both the IPAR_limit_latch_B and Duty_ser_limit_latch_B signals become equal to a logical one (Block 209), then the controller 23 again generates GA, GB, GA', and GB' so as to rectify currents induced in the secondary coil Ls while performing in-phase serial regulation (Block 210).

The system remains in serial in-phase regulation until the elapsed time becomes greater than the minimum time (Block 211). Once this has occurred, the system continues checking if the IPAR_limit_latch_B and Duty_ser_limit_latch_B signals are both at a logical one, and if the two conditions are still true then it continues with in-phase serial regulation.

However, if the output exceeds the reference voltage plus a tolerance margin (set at 200 mV in the example Block 212) while the time has not yet elapsed, the signal 101 rises to logical one and ULP_Auto_En falls to zero and then the controller 23 returns to generating the control signals G1-G4 and G1a-G4a so as to cause the transistors M1-M4 and M1a-M4a of the regtifier 25' to perform anti-phase parallel regulation. The system therefore also has the capability of self-exiting the in-phase serial loop with the highest priority in the event that Vrect is too high, which helps guarantee that if the system entered the in-phase serial regulation for less than the elapsed time, but the incoming power is getting too high by coincidence, the system is yet able to exit the in-phase serial mode and enter the anti-phase parallel anti-phase mode.

This way, the regtifier 24' is switched between in-phase serial voltage regulation and anti-phase parallel voltage regulation on the fly, with the in-phase serial voltage regulation being used from powerup/reset and until the closed loop in-phase serial regulation has the regtifier 24' operating at less than a 10% duty cycle (indicated by the Duty_Ser_SH signal falling below the Duty_Ser_Limit signal), at which point anti-phase parallel voltage regulation is used. The continues until anti-phase parallel voltage regulation has been used for a given period of time as well as until the anti-phase parallel current falls below a current threshold (the duty cycle limit detection Duty_Ser_Limit_Latch_B being asserted by default during parallel regulation), at which point serial regulation is returned to. Then, if serial regulation has not yet been used for a given period of time but the output voltage Vrect becomes greater than the reference voltage Vref+200mv, parallel voltage regulation is returned to. Otherwise the serial regulation remains and loop until the duty cycle falls too low.

Therefore, in summary, in-phase serial voltage regulation is used until the duty cycle of the regtifier 25' fall below 10%, meaning that 90% of the power dissipation capability of the regtifier 25' is being utilized. At that point, anti-phase parallel voltage regulation is used for its additional power dissipation capabilities. Parallel voltage regulation has the capability to cease serial regulation in case the regulated voltage becomes too high during a given time window, and anti-phase voltage regulation is used until the current it draws fall below a defined limit. This advantageously allows for the proper voltage regulation scheme to be used given the current operation conditions.

G. Advantages

The in-phase serial voltage regulation and anti-phase parallel voltage regulation schemes offer a variety of advantages, including the significant area savings provided by eliminating a separate discrete voltage regulator (including a power transistor and a tank capacitor) such as a low dropout amplifier, as well as power savings when the wireless power transmission system 20 is operating at equilibrium. In addition, these schemes spread excess power consumption over four devices (transistors M1-M4), instead of all excess power consumption being absorbed by a single power transistor within an additional voltage regulator. Still further, these schemes permit easy utilization of the receiver 22 as a transmitter, since direct access to node N1 (at which the voltage Vrect is developed) is available.

Efficiency differences between a prior art wireless power transmission system and the wireless power transmission system 20 are illustrated in the table below:

| Value | Rectifier + Regulator | Regtifier |
|---|---|---|
| Vrect | 5.2 V | 4.99 V with 50 mV ripple |
| Power Delivered by TX | 5.84 W | 5.63 W |
| Power Received by RX | 5.43 W | 5.23 W |
| Power Deliverd to Load | 4.97 W | 4.97 W |
| Efficiency of Rectifier + Regulator | 91.57% | NA |
| Efficiency of Regtifier | NA | 95.11% |
| Power lost | 457 mW | 255 mW |
| System efficiency | 85.11% | 87.88% |

Among other advantages, note that the system efficiency increases by nearly 3%

Figure 11B:
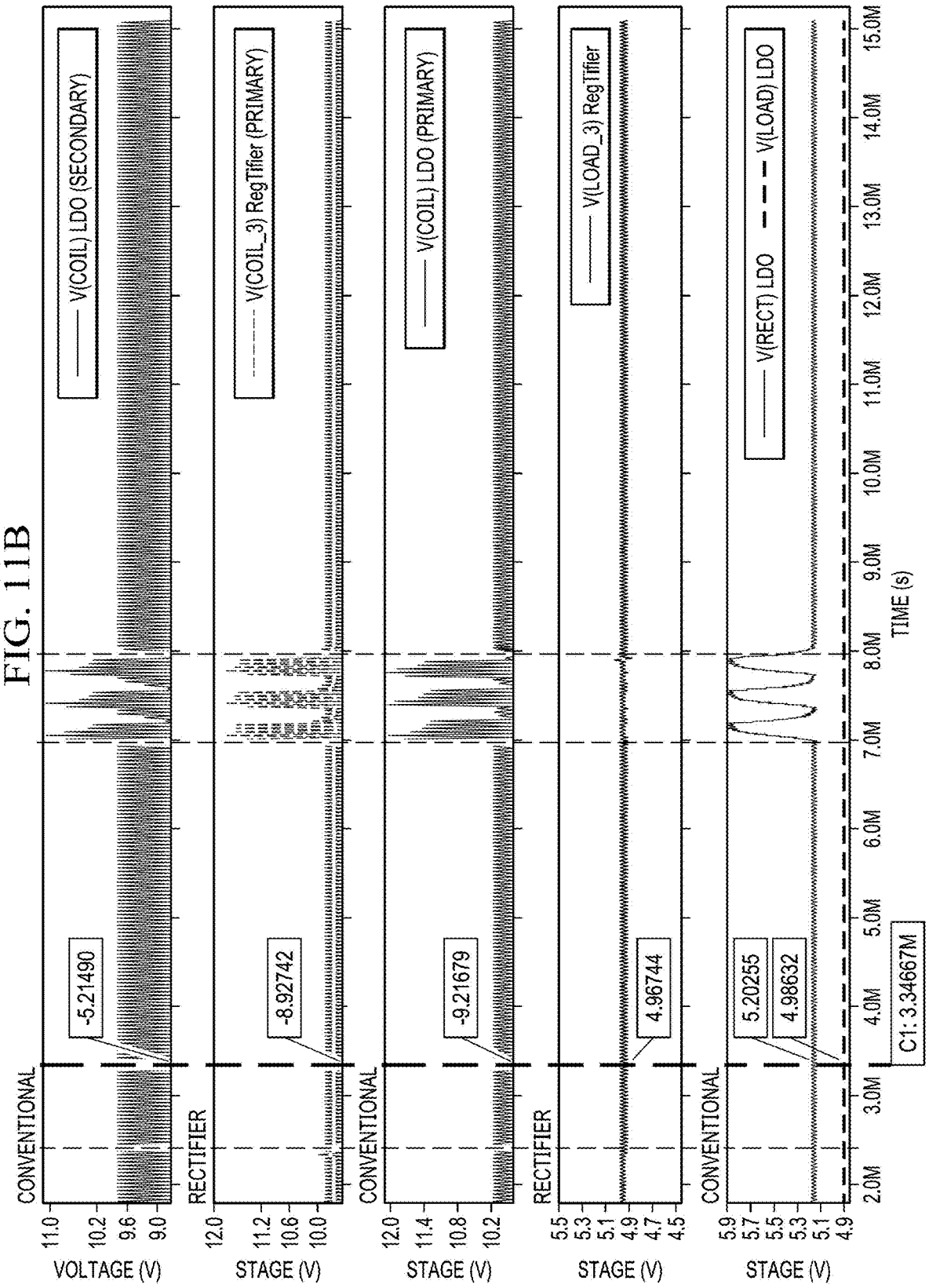
FIG. 11 is a timing diagram showing voltages of the wireless power transmission system of FIG. 2 in operation, wherein the feedback loop switches between controlling the bridge rectifier to perform in-phase serial voltage regulation and controlling the bridge rectifier to perform anti-phase parallel voltage regulation illustrating FSK symbols transmitted during power transmission.

Another advantage provided is that when the operation of the wireless power transmission system 20 includes data communication together with power transfer, such as by using amplitude shift keying (ASK) when data transmission is from the receiver 22 to the transmitter 21, the data symbols (ASK symbols) received by the transmitter 21 are cleaner. This can be seen in FIG. 11, where the signal received by the transmitter 21 (labeled as Vcoil LDO primary) using a prior art wireless power transmission system 20 contains decreasing amplitude peaks in its pulses, but where the signal received by the transmitter 21 (labeled as Vcoil_3 Regtifier) contains flat amplitude peaks in its pulses using the wireless data transmission system 20, which is easing the symbols extraction at primary side.

Also, when ASK data transmission is performed using a prior art power transmission system, the modulation depth changes depending upon the incoming power and the magnitude of the output voltage Vrect, since the drain to source resistance of the power transistor of a discrete voltage regulator will vary greatly depending upon the incoming power and the magnitude of the output voltage Vrect. However, when using the wireless data transmission system 20 described herein, the drain to source resistance of the four transistors M1-M4 of the regtifier varies far less than that of the single power transistor of a discrete voltage regulator, maintaining the modulation depth at a generally constant level.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A wireless power reception system, comprising:
a bridge rectifier arrangement of transistors receiving an input time varying power signal and being coupled between ground and an output node;
a feedback device receiving input from the output node and generating a feedback signal therefrom; and
a control circuit coupled to receive the input time varying power signal and the feedback signal, and generating gate voltages for the transistors of the bridge rectifier arrangement based upon the input time varying power signal and the feedback signal to cause:
turn on of two transistors of the bridge rectifier arrangement during a first phase, and turn on of two other transistors of the bridge rectifier arrangement during a second phase, to thereby cause rectification of the input time varying power signal to produce an output voltage at the output node; and
modulation of a gate voltage of at least one transistor of the bridge rectifier arrangement during the first phase, and modulation of a gate voltage of at least one other transistor of the bridge rectifier arrangement during the second phase, to thereby cause dissipation of excess power delivered by the input time varying power signal and therefore perform output voltage regulation on top of rectification.

2. The wireless power reception system of claim 1,
wherein the at least one transistor that has its gate voltage modulated during the first phase is one of the two transistors that is turned on during the first phase;
wherein the at least one other transistor that has its gate voltage modulated during the second phase is one of the two transistors that is turned on during the second phase; and
wherein the modulation of the gate voltage of the at least one transistor during the first phase and the modulation of the gate voltage of the at least one other transistor during the second phase serves to modulate a drain to source resistance of the at least one transistor and the at least one other transistor so that the excess power delivered by the input time varying power signal is dissipated.

3. The wireless power reception system of claim 2, wherein the at least one transistor that has its gate voltage modulated during the first phase is a high side transistor; and wherein the at least one other transistor that has its gate voltage modulated during the second phase is a high side transistor.

4. The wireless power reception system of claim 2, wherein the at least one transistor that has its gate voltage modulated during the first phase is a low side transistor; and wherein the at least one other transistor that has its gate voltage modulated during the second phase is a low side transistor.

5. The wireless power reception system of claim 1,
wherein the at least one transistor that has its gate modulated during the first phase is not one of the two transistors that is turned on during the first phase;
wherein the at least one other transistor that has its gate modulated during the second phase is not one of the two transistors that is turned on during the second phase; and
wherein the modulation of the gate voltage of the at least one transistor during the first phase and the modulation of the gate voltage of the at least one other transistor during the second phase serves to sufficiently turn on the at least one transistor and the at least one other transistor so that the excess power delivered by the input time varying power signal is dissipated.

6. The wireless power reception system of claim 5, wherein the at least one transistor that has its gate voltage modulated during the first phase is a high side transistor; and wherein the at least one other transistor that has its gate voltage modulated during the second phase is a high side transistor.

7. The wireless power reception system of claim 5, wherein the at least one transistor that has its gate voltage modulated during the first phase is a low side transistor; and wherein the at least one other transistor that has its gate voltage modulated during the second phase is a low side transistor.

8. The wireless power reception system of claim 1, wherein the feedback device comprises an amplifier having a non-inverting input terminal coupled to the output node, an inverting input terminal coupled to a reference voltage, and an output at which the feedback signal is generated.

9. The wireless power reception system of claim 8, wherein the reference voltage is a desired output voltage; wherein the amplifier amplifies the feedback signal if the output voltage at the output node exceeds the reference voltage, and the control circuit adjusts the modulation of the gate voltage of at least one transistor of the bridge rectifier arrangement during the first phase, and modulation of a gate voltage of at least one other transistor of the bridge rectifier arrangement during the second phase to cause sufficient dissipation of excess power delivered by the input time varying signal such that the output voltage at the output node remains close to the reference voltage.

10. The wireless power reception system of claim 1,
wherein the bridge rectifier arrangement of transistors is comprised of series coupled second and third transistors connected between the output node and ground, and series coupled first and fourth transistors connected between the output node and ground;
wherein the two transistors that are turned on during the first phase are the first and second transistor, and the two transistors that are turned on during the second phase are the third and fourth transistors;
wherein the at least one transistor that has its gate voltage modulated during the first phase is the first transistor; and
wherein the at least one transistor that has its gate voltage modulated during the second phase is the third transistor.

11. The wireless power reception system of claim 1,
wherein the bridge rectifier arrangement of transistors is comprised of series coupled second and third transistors connected between the output node and ground, and series coupled first and fourth transistors connected between the output node and ground;
wherein the two transistors that are turned on during the first phase are the first and second transistor, and the two transistors that are turned on during the second phase are the third and fourth transistors;
wherein the at least one transistor that has its gate voltage modulated during the first phase is the second transistor; and
wherein the at least one transistor that has its gate voltage modulated during the second phase is the fourth transistor.

12. The wireless power reception system of claim 1,
wherein the bridge rectifier arrangement of transistors is comprised of series coupled second and third transistors connected between the output node and ground, and series coupled first and fourth transistors connected between the output node and ground;
wherein the two transistors that are turned on during the first phase are the first and second transistor, and the two transistors that are turned on during the second phase are the third and fourth transistors;
wherein the at least one transistor that has its gate voltage modulated during the first phase is the first transistor and the second transistor; and
wherein the at least one transistor that has its gate voltage modulated during the second phase is the third transistor and the fourth transistor.

13. The wireless power reception system of claim 1,
wherein the bridge rectifier arrangement of transistors is comprised of series coupled second and third transistors connected between the output node and ground, and series coupled first and fourth transistors connected between the output node and ground;
wherein the two transistors that are turned on during the first phase are the first and second transistor, and the two transistors that are turned on during the second phase are the third and fourth transistors;
wherein the at least one transistor that has its gate voltage modulated during the first phase is the third transistor; and
wherein the at least one transistor that has its gate voltage modulated during the second phase is the first transistor.

14. The wireless power reception system of claim 1,
wherein the bridge rectifier arrangement of transistors is comprised of series coupled second and third transistors connected between the output node and ground, and series coupled first and fourth transistors connected between the output node and ground;
wherein the two transistors that are turned on during the first phase are the first and second transistor, and the two transistors that are turned on during the second phase are the third and fourth transistors;
wherein the at least one transistor that has its gate voltage modulated during the first phase is the fourth transistor; and
wherein the at least one transistor that has its gate voltage modulated during the second phase is the second transistor.

15. The wireless power reception system of claim 1,
wherein the bridge rectifier arrangement of transistors is comprised of series coupled second and third transistors connected between the output node and ground, and series coupled first and fourth transistors connected between the output node and ground;
wherein the two transistors that are turned on during the first phase are the first and second transistor, and the two transistors that are turned on during the second phase are the third and fourth transistors;
wherein the at least one transistor that has its gate voltage modulated during the first phase is the third and fourth transistor; and
wherein the at least one transistor that has its gate voltage modulated during the second phase is the first and second transistor.

16. The wireless power reception system of claim 1, wherein the control circuit comprises:
a control signal generator configured to:
during the first phase, generate a first control signal that has a voltage magnitude sufficient to fully turn on the two transistors of the bridge rectifier arrangement, and generate a second control signal that has a voltage magnitude low enough to fully turn off the two other transistors of the bridge rectifier arrangement; and
during the second phase, generate the second control signal as having a voltage magnitude sufficient to fully turn on the two other transistors of the bridge rectifier arrangement, and generating the first control signal as having a voltage magnitude low enough to fully turn off the two transistors of the bridge rectifier arrangement;

a first switch circuit configured to:
  during the first phase, generate the gate voltage for the at least one transistor by generating the gate voltage as being equal to a voltage of the first control signal less a voltage of the feedback signal; and
  during the second phase, generate the gate voltage for the at least one transistor by generating the gate voltage as being equal to the voltage of the first control signal; and a second switch circuit configured to:
  during the first phase, generate the gate voltage for the at least one other transistor by generating the gate voltage as being equal to a voltage of the second control signal; and
  during the second phase, generate the gate voltage for the at least one other transistor by generating the gate voltage as being equal to a voltage of the second control signal less a voltage of the feedback signal.

17. The wireless power reception system of claim 1, wherein the control circuit comprises:
  a control signal generator configured to:
    during the first phase, generate a first control signal that has a voltage magnitude sufficient to fully turn on the two transistors of the bridge rectifier arrangement, and generate a second control signal that has a voltage magnitude low enough to fully turn off the two other transistors of the bridge rectifier arrangement; and
    during the second phase, generate the second control signal as having a voltage magnitude sufficient to fully turn on the two other transistors of the bridge rectifier arrangement, and generating the first control signal as having a voltage magnitude low enough to fully turn off the two transistors of the bridge rectifier arrangement;
  a first switch circuit configured to:
    during the first phase, generate a gate voltage for the at least one transistor as being equal to the voltage of the first control signal; and
    during the second phase, generate the gate voltage for the at least one transistor as being equal to a sum of the voltage of the first control signal and a voltage of the feedback signal; and
  a second switch circuit configured to:
    during the first phase, generate a gate voltage for the at least one other transistor as being equal to a sum of the voltage of the second control signal and the voltage of the feedback signal; and
    during the first phase, generate the gate voltage for the at least one other transistor as being equal to the voltage of the second control signal.

18. The wireless power reception system of claim 1, wherein the at least one transistor that has its gate voltage modulated during the first phase is one of the two transistors that is turned on during the first phase;
  wherein the at least one other transistor that has its gate voltage modulated during the second phase is one of the two transistors that is turned on during the second phase; and
  wherein the modulation of the gate voltage of the at least one transistor during the first phase and the modulation of the gate voltage of the at least one other transistor during the second phase is performed via pulse width modulation.

19. The wireless power reception system of claim 18, wherein the at least one transistor that has its gate voltage modulated during the first phase is a high side transistor; and wherein the at least one transistor that has its gate voltage modulated during the second phase is a high side transistor.

20. The wireless power reception system of claim 18, wherein the at least one transistor that has its gate voltage modulated during the first phase is a low side transistor; and wherein the at least one transistor that has its gate voltage modulated during the second phase is a low side transistor.

21. The wireless power reception system of claim 18,
  wherein the feedback device is a comparator having a non-inverting input terminal coupled to the output node, an inverting input terminal coupled to a reference voltage that is equal to a desired output voltage, and an output generating the feedback signal in digital form;
  wherein the comparator asserts the feedback signal when the output voltage exceeds the reference voltage; and
  wherein the control circuit modulates the gate voltage of the at least one transistor during the first phase by pulling the gate voltage of the at least one transistor low when the feedback signal is asserted, and modulates the gate voltage of the at least one other transistor during the second phase by pulling the gate voltage of the at least one other transistor low when the feedback signal is asserted.

22. The wireless power reception system of claim 1,
  wherein the control circuit turns on the two transistors of the bridge rectifier arrangement during the first phase by generating their respective gate voltages as having a first constant magnitude;
  wherein the at least one transistor that has its gate voltage modulated during the first phase is one of the two transistors that is turned on during the first phase;
  wherein the control circuit modulates the gate voltage of the at least one transistor during the first phase by reducing its gate voltage so that its magnitude drops from the first constant magnitude to a second constant magnitude less than the first constant magnitude;
  wherein the control circuit turns on the two other transistors of the bridge rectifier arrangement during the second phase by generating their respective gate voltages as having the first constant magnitude;
  wherein the at least one transistor that has its gate voltage modulated during the second phase is one of the two transistors that is turned on during the second phase; and
  wherein the control circuit modulates the gate voltage of the at least one transistor during the second phase by reducing its gate voltage so that its magnitude drops from the first constant magnitude to the second constant magnitude.

23. The wireless power reception of claim 22, wherein the at least one transistor that has its gate voltage modulated during the first phase is a high side transistor; and wherein the at least one transistor that has its gate voltage modulated during the second phase is a high side transistor.

24. The wireless power reception of claim 22, wherein the at least one transistor that has its gate voltage modulated during the first phase is a low side transistor; and wherein the at least one transistor that has its gate voltage modulated during the second phase is a low side transistor.

25. The wireless power reception system of claim 1,
wherein the bridge rectifier arrangement of transistors comprises first and fourth transistors coupled in series between the output node and ground, and third and second transistors coupled in series between the output node and ground;
wherein the feedback device is a comparator having a non-inverting input terminal coupled to the output node, an inverting input terminal coupled to a reference voltage that is equal to a desired output voltage, and an output generating the feedback signal in digital form;
wherein the comparator asserts the feedback signal when the output voltage exceeds the reference voltage;
wherein the control circuit turns on the first and second transistors of the bridge rectifier during the first phase by generating their respective gate voltages as having a first constant magnitude, and turns on the third and fourth transistors of the bridge rectifier during the second phase by generating their respective gate voltages as having the first constant magnitude;
wherein the control circuit modulates the gate voltage of at least one of the first and second transistors during the first phase in response to assertion of the feedback signal by reducing that gate voltage so that its magnitude drops from the first constant magnitude to a second constant magnitude less than the first constant magnitude;
wherein the control circuit modulates the gate voltage of at least one of the third and fourth transistors during the second phase in response to assertion of the feedback signal; and
wherein the control circuit modulates the gate voltage of at least one of the third and fourth transistors during the second phase in response to assertion of the feedback signal by reducing that gate voltage so that its magnitude drops from the first constant magnitude to the second constant magnitude.

26. The wireless power reception system of claim 25, wherein the control circuit modulates the gate voltage of only the first transistor during the first phase in response to assertion of the feedback signal; and wherein the control circuit modulates the gate voltage of only the third transistor during the second phase in response to assertion of the feedback signal.

27. The wireless power reception system of claim 25, wherein the control circuit modulates the gate voltage of only the second transistor during the first phase in response to assertion of the feedback signal; and wherein the control circuit modulates the gate voltage of only the fourth transistor during the second phase in response to assertion of the feedback signal.

28. A wireless power reception system, comprising:
a bridge rectifier arrangement of transistors receiving an input time varying power signal and being coupled between ground and an output node;
wherein the bridge rectifier arrangement of transistors comprises:
a first transistor and a first companion transistor coupled in parallel between the output node and a first node, wherein a gate of the first transistor is coupled to receive a first gate voltage and a gate of the first companion transistor is coupled to receive a first companion gate voltage;
a fourth transistor and a fourth companion transistor coupled in parallel between the first node and ground, wherein a gate of the fourth transistor is coupled to receive a fourth gate voltage and a gate of the fourth companion transistor is coupled to receive a fourth companion gate voltage;
a third transistor and a third companion transistor coupled in parallel between the output node and a second node, wherein a gate of the third transistor is coupled to receive a third gate voltage and a gate of the third companion transistor is coupled to receive a third companion gate voltage;
a second transistor and a second companion transistor coupled in parallel between the second node and ground, wherein a gate of the second transistor is coupled to receive a second gate voltage and a gate of the second companion transistor is coupled to receive a second companion gate voltage;
a feedback device receiving input from the output node and generating a feedback signal therefrom; and
a control circuit coupled to receive the input time varying power signal and the feedback signal, and generating gate voltages for the transistors of the bridge rectifier arrangement to cause:
turn on of the first transistor, first companion transistor, second transistor, and second companion transistor during a first phase, and turn on of the third transistor, third companion transistor, fourth transistor, and fourth companion transistor during a second phase, to thereby cause rectification of the input time varying power signal to produce an output voltage at the output node; and
turn off of at least one of the first transistor and the second transistor prior to an end of the first phase, and turn off of at least one of the third transistor and the fourth transistor prior to an end of the second phase, to thereby cause dissipation of excess power delivered by the input time varying power signal.

29. The wireless power reception system of claim 28, wherein the first transistor and first companion transistor have a same length but a different width to length ratio; wherein the second transistor and second companion transistor have a same length but different width to length ratio; wherein the third transistor and third companion transistor have a same length but different width to length ratio; and wherein the fourth transistor and fourth companion transistor have a same length but different width to length ratio.

30. The wireless power reception system of claim 29, wherein the first transistor is greater in width to length ratio than the first companion transistor; wherein the second transistor is greater in width to length ratio than the second companion transistor; wherein the third transistor is greater in width to length ratio than the third companion transistor; and wherein the fourth transistor is greater in width to length ratio than the fourth companion transistor.

31. The wireless power reception system of claim 28, wherein the control circuit generates the gate voltages for the transistors of the bridge arrangement so as to cause turn off of the first transistor and the second transistor prior to an end of the first phase, and turn off of the third transistor and the fourth transistor prior to an end of the second phase.

32. The wireless power reception system of claim 28, wherein the control circuit generates the gate voltages for the transistors of the bridge arrangement so as to cause turn off of the first transistor prior to an end of the first phase, and turn off of the third transistor prior to an end of the second phase.

33. The wireless power reception system of claim 28, wherein the control circuit generates the gate voltages for the transistors of the bridge arrangement so as to cause turn off of the second transistor prior to an end of the first phase, and turn off of the fourth transistor prior to an end of the second phase.

34. The wireless power reception system of claim 28,
wherein the feedback device is a comparator having a non-inverting input terminal coupled to the output node, an inverting input terminal coupled to a reference voltage that is equal to a desired output voltage, and an output generating the feedback signal in digital form;
wherein the comparator asserts the feedback signal when the output voltage exceeds the reference voltage;
wherein the control circuit turns off at least one of the first transistor and the second transistor prior to the end of the first phase by pulling the respective gate voltage low in response to assertion of the feedback signal; and
wherein the control circuit turns off at least one of the third transistor and the fourth transistor prior to the end of the first phase by pulling the respective gate voltage low in response to assertion of the feedback signal.

35. A wireless power reception system, comprising:
a bridge rectifier arrangement of transistors receiving an input time varying power signal and being coupled between ground and an output node;
a feedback device receiving input from the output node and generating a feedback signal therefrom; and
a control circuit coupled to receive the input time varying power signal and the feedback signal, and generating gate voltages for the transistors of the bridge rectifier arrangement based upon the input time varying power signal and the feedback signal to cause:
turn on of two transistors of the bridge rectifier arrangement during a first phase, and turn on of two other transistors of the bridge rectifier arrangement during a second phase, to thereby cause rectification of the input time varying power signal to produce an output voltage at the output node; and
modulation of a gate voltage of at least one transistor of the bridge rectifier arrangement during the first phase, and modulation of a gate voltage of at least one other transistor of the bridge rectifier arrangement during the second phase, to thereby cause dissipation of excess power delivered by the input time varying power signal;
wherein, based upon operating conditions of the wireless power reception system, the control circuit operates the bridge rectifier arrangement in an in-phase serial configuration and operates the bridge rectifier arrangement in an anti-phase parallel configuration.

36. The wireless power reception system of claim 35, wherein one of the two transistors turned on during the first phase is a high side transistor and the other of the two transistors turned on during the first phase is a low side transistor; wherein one of the two transistors turned on during the second phase is a low side transistor and the other of the two transistors turned on during the second phase is a high side transistor; and the control circuit operates the bridge rectifier arrangement in the in-phase serial configuration by modulating the gate voltage of the high side transistors, and operates the bridge rectifier arrangement in the anti-phase parallel configuration by modulating the gate voltage of the low side transistor not turned on during the first phase, during the first phase, and by modulating the gate voltage of the low side transistor not turned on during the second phase, during the second phase.

37. The wireless power reception system of claim 36, wherein the modulation of the gate voltages in the in-phase serial configuration is performed via pulse width modulation.

38. The wireless power reception system of claim 35, wherein one of the two transistors turned on during the first phase is a high side transistor and the other of the two transistors turned on during the first phase is a low side transistor; wherein one of the two transistors turned on during the second phase is a low side transistor and the other of the two transistors turned on during the second phase is a high side transistor; and the control circuit operates the bridge rectifier arrangement in the in-phase serial configuration by modulating the gate voltage of the low side transistors, and operates the bridge rectifier arrangement in the anti-phase parallel configuration by modulating the gate voltage of the high side transistor not turned on during the first phase, during the first phase, and by modulating the gate voltage of the high side transistor not turned on during the second phase, during the second phase.

39. The wireless power reception system of claim 38, wherein the modulation of the gate voltages in the in-phase serial configuration is performed via pulse width modulation.

40. The wireless power reception system of claim 35, wherein, based upon operating conditions of the wireless power reception, the control circuit switches between generating the gate voltages so as to operate the bridge rectifier arrangement in an in-phase serial configuration, and to operate the bridge rectifier arrangement in an anti-phase parallel configuration.

41. The wireless power reception system of claim 35, wherein the operating conditions are an amount of excess power to be dissipated.

42. The wireless power reception system of claim 41, wherein the control circuit switches to generating the gate voltage so as to operate the bridge rectifier arrangement in the in-phase serial configuration when the excess power to be dissipated is below a threshold, but switches to generating the gate voltage so as to operate the bridge rectifier arrangement in the anti-phase parallel configuration when the excess power to be dissipated is above the threshold.

43. The wireless power reception system of claim 35, wherein the control circuit switches between operating the bridge rectifier in the in-phase serial configuration and in the anti-phase parallel configuration dependent upon whether a current phase is the first phase or the second phase.

44. The wireless power reception system of claim 35, wherein the control circuit switches between operating the bridge rectifier in the in-phase serial configuration and in the anti-phase parallel configuration dependent upon the passage of a given number of phases.

45. The wireless power reception system of claim 35, wherein, when in the in-phase serial configuration:
the at least one transistor that has its gate voltage modulated during the first phase is one of the two transistors that is turned on during the first phase;
the at least one other transistor that has its gate voltage modulated during the second phase is one of the two transistors that is turned on during the second phase; and
the modulation of the gate voltage of the at least one transistor during the first phase and the modulation of the gate voltage of the at least one other transistor during the second phase serves to modulate a drain to source resistance of the at least one transistor and the at least one other transistor so that the excess power delivered by the input time varying power signal is dissipated.

46. The wireless power reception system of claim 35, wherein, when in the in-phase serial configuration:
the at least one transistor that has its gate voltage modulated during the first phase is one of the two transistors that is turned on during the first phase;
the at least one other transistor that has its gate voltage modulated during the second phase is one of the two transistors that is turned on during the second phase; and
the modulation of the gate voltage of the at least one transistor during the first phase and the modulation of the gate voltage of the at least one other transistor during the second phase is performed via pulse width modulation.

47. The wireless power reception system of claim 35, wherein, when in the anti-phase parallel configuration:
the at least one transistor that has its gate modulated during the first phase is not one of the two transistors that is turned on during the first phase;
the at least one other transistor that has its gate modulated during the second phase is not one of the two transistors that is turned on during the second phase; and
the modulation of the gate voltage of the at least one transistor during the first phase and the modulation of the gate voltage of the at least one other transistor during the second phase serves to sufficiently turn on the at least one transistor and the at least one other transistor so that the excess power delivered by the input time varying power signal is dissipated.

* * * * *